(12) United States Patent
Partsch

(10) Patent No.: US 12,374,388 B2
(45) Date of Patent: Jul. 29, 2025

(54) BUFFERED DYNAMIC RANDOM ACCESS MEMORY DEVICE

(71) Applicant: Rambus Inc., San Jose, CA (US)

(72) Inventor: Torsten Partsch, San Jose, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 18/649,739

(22) Filed: Apr. 29, 2024

(65) Prior Publication Data

US 2024/0395315 A1    Nov. 28, 2024

Related U.S. Application Data

(63) Continuation of application No. 17/728,638, filed on Apr. 25, 2022, now Pat. No. 12,002,506.

(60) Provisional application No. 63/188,223, filed on May 13, 2021.

(51) Int. Cl.
| | | |
|---|---|---|
| *G11C 11/00* | (2006.01) | |
| *G11C 11/4076* | (2006.01) | |
| *G11C 11/4093* | (2006.01) | |
| *G11C 11/4096* | (2006.01) | |

(52) U.S. Cl.
CPC ...... *G11C 11/4096* (2013.01); *G11C 11/4076* (2013.01); *G11C 11/4093* (2013.01)

(58) Field of Classification Search
CPC ....... G11C 5/04; G11C 7/1066; G11C 7/1093; G11C 29/028; G11C 7/222; G11C 7/109; G11C 29/023; G11C 7/1006; G11C 8/12; G11C 8/18; G11C 11/4076; G11C 11/4093; G11C 11/4096; G11C 2207/108; G11C 2207/2254; G11C 7/1045; G11C 7/1069; G11C 7/1084; G11C 7/1096; G11C 16/00; G11C 2029/0407; G11C 7/20; G11C 2207/105; G11C 7/1057; G11C 29/021; G11C 29/10; G11C 29/1201; G11C 29/12015; G11C 7/1009; G11C 7/1048;

(Continued)

(56) References Cited

U.S. PATENT DOCUMENTS

| | | |
|---|---|---|
| 7,020,757 B2 | 3/2006 | Ruhovets et al. |
| 7,366,822 B2 | 4/2008 | Kwak et al. |
| 7,414,917 B2 | 8/2008 | Ruckerbauer et al. |

(Continued)

OTHER PUBLICATIONS

Gjessing et al., "A RAM Link for High Speed", IEEE, 1992, pp. 52-53. 2 Pages.

(Continued)

*Primary Examiner* — Thong Q Le
(74) *Attorney, Agent, or Firm* — The Neudeck Law Firm, LLC

(57) ABSTRACT

A DRAM device may be configured to retransmit or not retransmit zero or more of command/address signals, write data signals, read data signals, and/or data strobe signals. The DRAM device may have separate, unidirectional read data signal and write data signal interfaces. Combined activate and read or write commands may be implemented. The configuration of the DRAM to retransmit or not retransmit signals may be determined by the DRAM device's physical location on a module via hardwired configuration pins. The various configurations allows a DRAM device to be used on both a long and narrow form factor module and a DIMM module.

20 Claims, 18 Drawing Sheets

(58) Field of Classification Search
CPC ............... G11C 7/1072; G11C 29/022; G11C 29/50012
See application file for complete search history.

(56) References Cited

U.S. PATENT DOCUMENTS 8,279,652 B2    10/2012  Choi
9,563,587 B2 *   2/2017  Lee ..................... G11C 7/1093

OTHER PUBLICATIONS

Gjessing, Stein et al., "RamLink: A High-Bandwidth Point-to-Point Memory Architecture", IEEE, 1992, pp. 328-331, 4 pages.

* cited by examiner

BUFFERED DYNAMIC RANDOM ACCESS MEMORY DEVICE

DETAILED DESCRIPTION OF THE EMBODIMENTS

Some emerging memory board/module form factors connect to the system at a narrow end of a long narrow circuit board. Thus, signals being transmitted/received by devices on these modules are densely packed and may need to propagate a relatively long distance (e.g., 318 mm).

In an embodiment, a dynamic random access memory (DRAM) device can support both a long and narrow module form factor (e.g., ESDFF) and a wider and shorter DIMM module form factor. The DRAM device may be configured to retransmit or not retransmit zero or more of command/address signals, write data signals, read data signals, and/or data strobe signals. In an embodiment, the DRAM device has separate, unidirectional read data signal and write data signal interfaces. A protocol with combined activate and read or write commands may be implemented. The configuration of the DRAM to retransmit or not retransmit signals may be determined by the DRAM device's physical location on a module. The various configurations allows a DRAM device to be used on both a long and narrow form factor module and a DIMM module.

Figure 1:
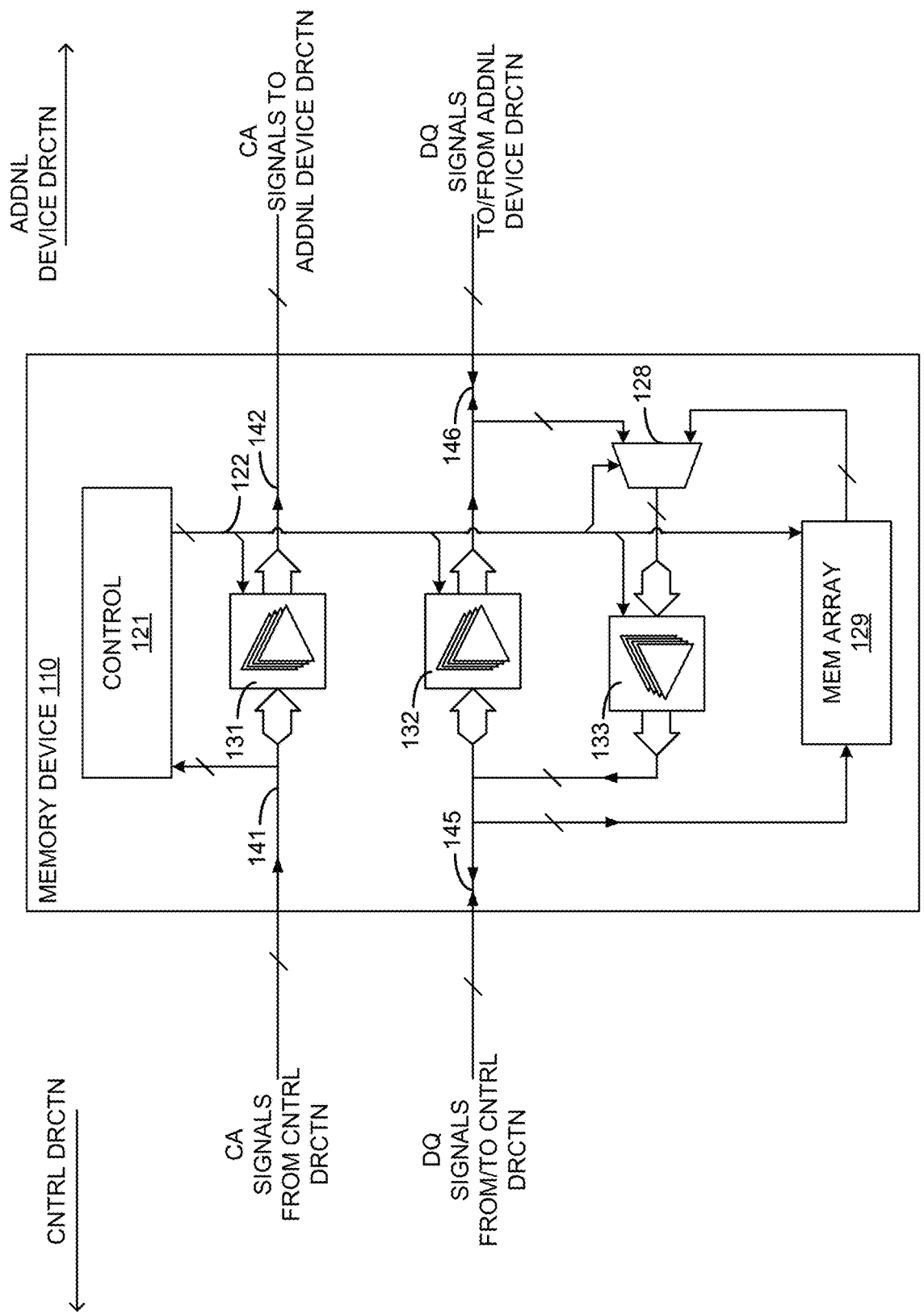
FIG. 1 is a block diagram illustrating a buffered dynamic random access memory (DRAM) device.

FIG. 1 is a block diagram illustrating a buffered dynamic random access memory (DRAM) device. In FIG. 1, memory device 110 comprises control 121, command/address signal (CA) buffers 131, data signal (DQ) buffers 132, DQ buffers 133, memory array 129, and DQ multiplexor (MUX) 128. Control 121 is operatively coupled to CA buffers 131, DQ buffers 132, DQ buffers 133, and MUX 128 via control signals 122. Control signals 222 control the operations of CA buffers 131, DQ buffers 132, DQ buffers 133, and MUX 128. MUX 128 is operatively coupled to select between DQ signals 146 and signals from memory array 129 under the control of control signals 122. The output of MUX 128 is provided to the input of DQ buffers 133.

Memory device 110 is operatively coupled to receive CA signals 141 from device(s) disposed in the (electrical) direction of a controller. Memory device 110 is operatively coupled to receive or transmit DQ signals 145 from or to, respectively, device(s) disposed in the (electrical) direction of a controller. This is illustrated in FIG. 1 by CA signals 141 and DQ signals 145 being illustrated as being connected to the left (controller direction) of memory device 110. Memory device 110 may be operatively coupled to transmit CA signals 142 to device(s) disposed away from the (electrical) direction of a controller. Memory device 110 may be operatively coupled to receive or transmit DQ signals 146 from or to, respectively, device(s) disposed away from the (electrical) direction of a controller. This is illustrated in FIG. 1 by CA signals 142 and DQ signals 146 being illustrated as being capable of being connected to the right (away from controller direction) of memory device 110.

The controller functionality manages the flow of data going to and from memory devices and/or memory modules (e.g., module 100.) A memory controller can be a separate, standalone chip, a buffer chip coupled to multiple host controllers (e.g., CXL buffer), or integrated into another chip. For example, a memory controller may be included on a single die with a microprocessor, or included as part of a more complex integrated circuit system such as a block of a system on a chip (SOC), or a part of a fabric interconnected system.

Memory device 110 receives CA signals 141 from the direction of a controller (not shown in FIG. 1). CA signals 141 are operatively coupled to control 121 and CA buffers 131. Memory device 110 receives and transmits DQ signals 145 from and to, respectively, the direction of the controller (not shown in FIG. 1). DQ signals 145 are operatively coupled to DQ buffers 132, DQ buffers 133, and memory array 129.

Memory device 110 may (re)transmit received CA signals 141 on CA signals 142 away from the direction of the controller using CA buffers 131 under the control of at least one control signal 122 from control 121. Memory device 110 may receive and (re)transmit received DQ signals 145 on DQ signals 146 away from the direction of the controller using DQ buffers 132 under the control of at least one control signal 122 from control 121. Memory device 110 may, when MUX 128 is configured appropriately by control 121, receive and (re)transmit received DQ signals 146 on DQ signals 145 in the direction of the controller using DQ buffers 133 under the control of at least one control signal 122 from control 121. Memory device 110 may, when MUX 128 is configured appropriately by control 121, transmit data received from memory array 129 on DQ signals 145 in the direction of the controller using DQ buffers 133 under the control of at least one control signal 122 from control 121. Memory device 110 may store, in memory array 129, data received via DQ signals 145 from the direction of the controller under the control of at least one control signal 122 from control 121.

Because CA buffers 131 are controlled by control 121, and control 121 may be configured by means external to memory device 110. (e.g., via CA signals 141, board connections, serial presence detect, etc.) it should be understood that memory device 110 may be configured to either retransmit or not retransmit received CA signals 141 to one or more additional devices that are disposed in the direction away from the controller. Likewise, because DQ buffers 132 are controlled by control 121, and control 121 may be configured by means external to memory device 110. (e.g., via CA signals 141, board connections, serial presence detect, etc.) it should be understood that memory device 110 may be configured to either retransmit or not retransmit received DQ signals 145 to one or more additional devices that are disposed in the direction away from the controller.

Furthermore, because DQ buffers 133, and MUX 128 are controlled by control 121, and control 121 may be configured by means external to memory device 110. (e.g., via CA signals 141, board connections, serial presence detect, etc.) it should be understood that memory device 110 may be configured (either dynamically or statically) to either retransmit or not retransmit received DQ signals 146 to one or more devices (such as a controller and/or additional DRAM devices) that are disposed in the direction away from the controller. For similar reasons, it should be understood that memory device 110 may be configured dynamically to transmit, via DQ signals 146, data from memory array 129 to one or more devices (such as a controller and/or additional DRAM devices) that are disposed in the direction away from the controller.

Figure 2A:
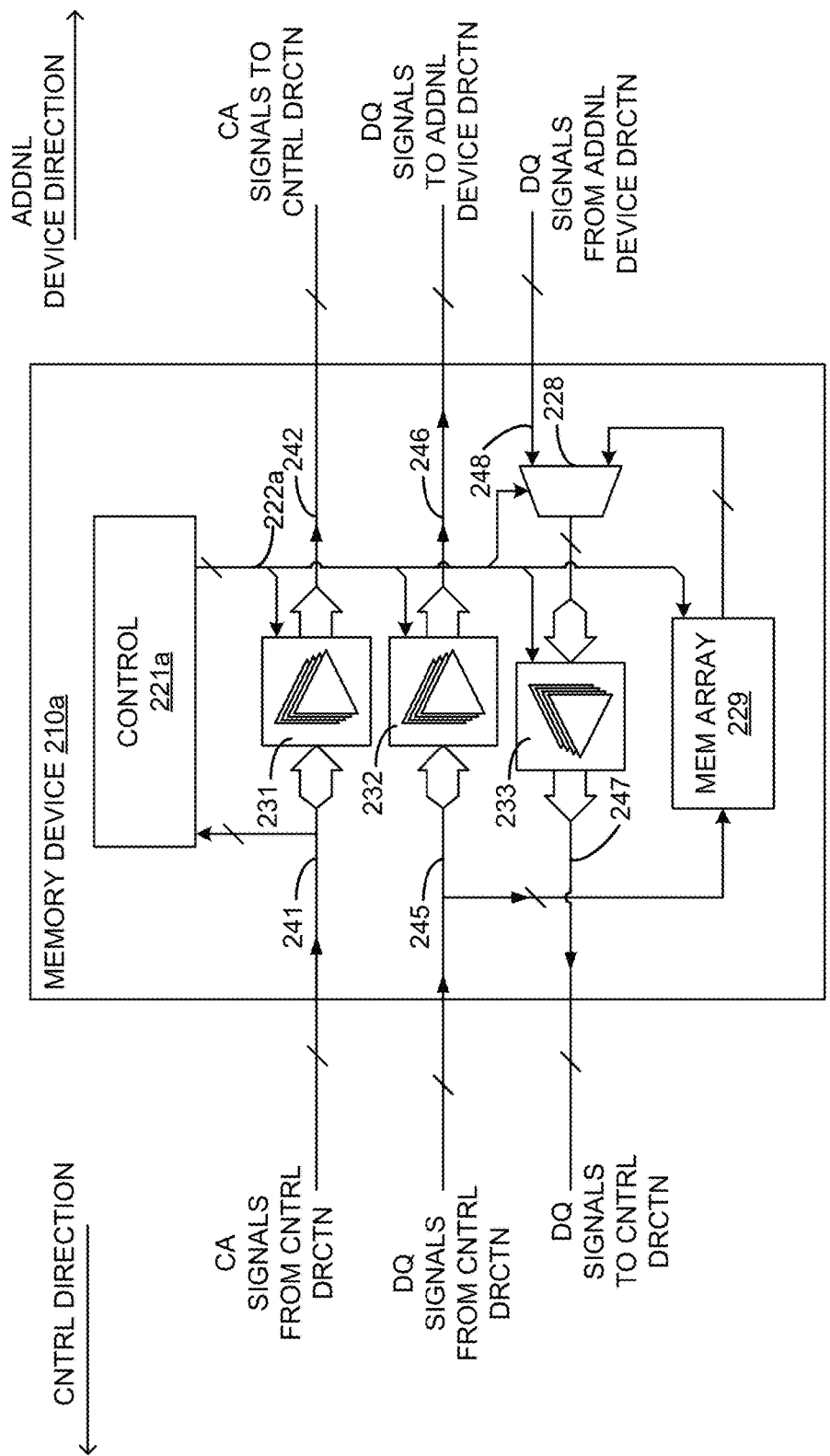
FIGS. 2A-2B are block diagrams illustrating buffered dynamic random access memories (DRAMs) with unidirectional data interfaces.
Figure 2B:
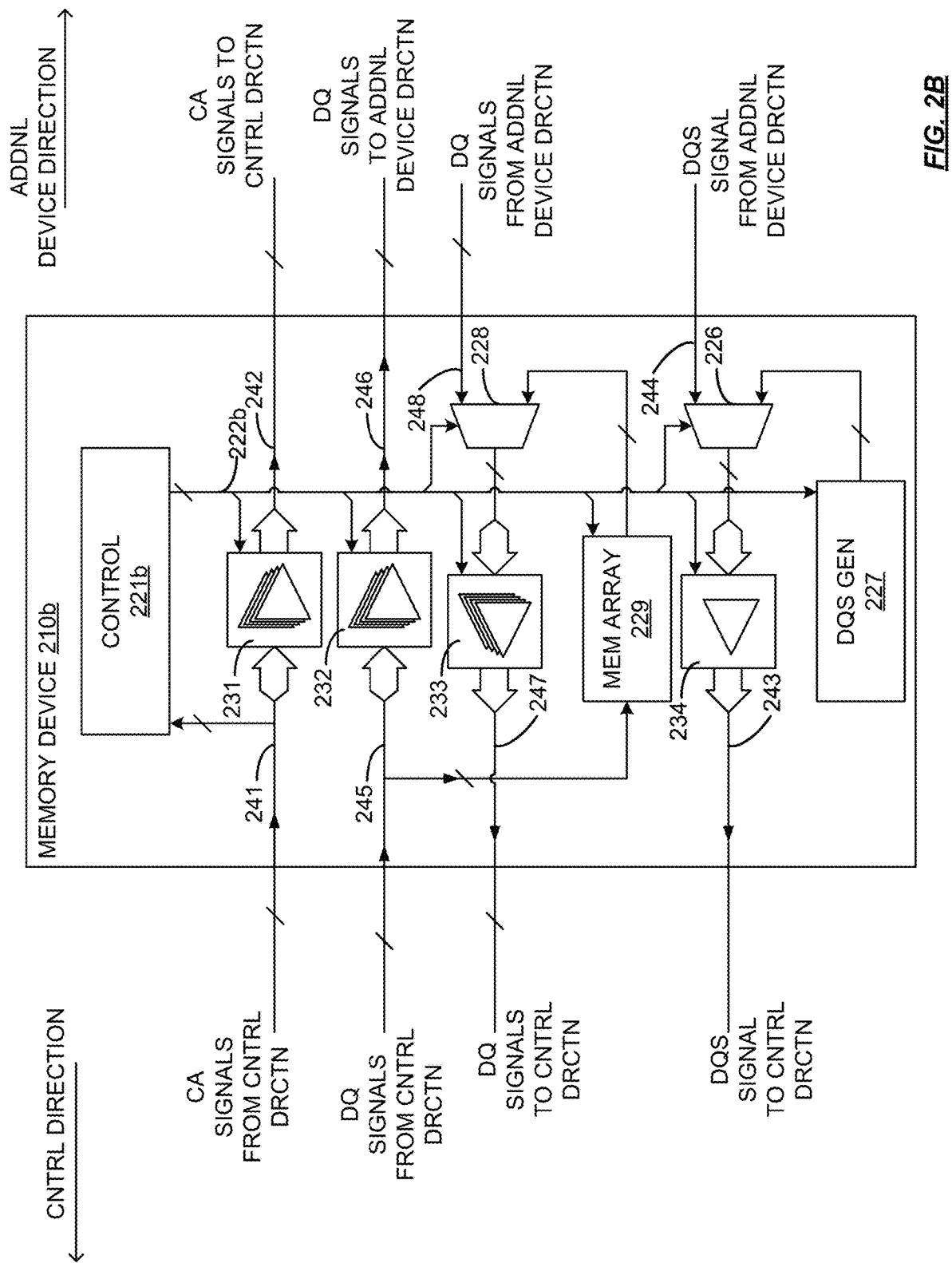

FIGS. 2A-2B are block diagrams illustrating buffered DRAMs with unidirectional data interfaces. In FIG. 2A, memory device 210a comprises control 221a, command/address signal (CA) buffers 231, data signal (DQ) buffers 232, DQ buffers 233, memory array 229, and DQ multiplexor (MUX) 228. Control 221 is operatively coupled to CA buffers 231, DQ buffers 232, DQ buffers 233, memory array 229, and MUX 228 via control signals 222a. Control signals 222a control the operations of CA buffers 231, DQ buffers 232, DQ buffers 233, memory array 229, and MUX 228. MUX 228 is operatively coupled to select between DQ signals 248 and signals from memory array 229 under the control of one or more control signals 222a. The output of MUX 228 is provided to the input of DQ buffers 233.

Memory device 210a is operatively coupled to receive CA signals 241 from device(s) disposed in the (electrical) direction of a controller. Memory device 210a is operatively coupled to receive DQ signals 245 from device(s) disposed in the (electrical) direction of the controller. Memory device 210a is operatively coupled to transmit DQ signals 247 to device(s) disposed in the (electrical) direction of a controller. This is illustrated in FIG. 2A by CA signals 241, DQ signals 245, and DQ signals 247 being illustrated as being connected to the left (controller direction) of memory device 210a. Memory device 210a may be operatively coupled to transmit CA signals 242 to device(s) disposed away from the (electrical) direction of a controller. Memory device 210a may be operatively coupled to transmit DQ signals 246 to device(s) disposed away from the (electrical) direction of a controller. Memory device 210a may be operatively coupled to receive DQ signals 248 from device(s) disposed away from the (electrical) direction of a controller. This is illustrated in FIG. 2A by CA signals 242, DQ signals 246, and DQ signals 248 being illustrated as being capable of being connected to the right (away from controller direction) of memory device 210a.

Memory device 210a receives CA signals 241 from the direction of a controller (not shown in FIG. 2). CA signals 241 are operatively coupled to control 221a and CA buffers 231. Memory device 210a receives DQ signals 245 from the direction of the controller (not shown in FIG. 2). Memory device 210a transmits DQ signals 247 to the direction of the controller (not shown in FIG. 2). DQ signals 245 are operatively coupled to DQ buffers 232, and memory array 229.

Memory device 210a may (re)transmit received CA signals 241 on CA signals 242 away from the direction of the controller using CA buffers 231 under the control of at least one control signal 222a from control 221a. Memory device 210 may receive and (re)transmit received DQ signals 245 on DQ signals 246 away from the direction of the controller using DQ buffers 232 under the control of at least one control signal 222a from control 221a. Memory device 210a may, when MUX 228 is configured appropriately by control 221a, receive and (re)transmit received DQ signals 248 on DQ signals 247 in the direction of the controller using DQ buffers 233 under the control of at least one control signal 222a from control 221a. Memory device 210a may, when MUX 228 is configured appropriately by control 221, transmit data received from memory array 229 on DQ signals 247 in the direction of the controller using DQ buffers 233 under the control of at least one control signal 222a from control 221a. Memory device 210a may store, in memory array 229, data received via DQ signals 245 from the direction of the controller under the control of at least one control signal 222a from control 221.

Because CA buffers 231 are controlled by control 221a, and control 221a may be configured by means external to memory device 210a, (e.g., via CA signals 241, board connections, serial presence detect, etc.) it should be understood that memory device 210a may be configured to either retransmit or not retransmit received CA signals 241 to one or more additional devices that are disposed in the direction away from the controller. Likewise, because DQ buffers 232 are controlled by control 221a, and control 221a may be controlled by means external to memory device 210a, (e.g., via CA signals 241, board connections, serial presence detect, etc.) it should be understood that memory device 210a may be configured to either retransmit or not retransmit received DQ signals 245 unidirectionally via DQ signals 246 to one or more additional devices that are disposed in the direction away from the controller.

Furthermore, because DQ buffers 233, and MUX 228 are controlled by control 221a, and control 221a may be configured by means external to memory device 210a (e.g., via CA signals 241, board connections, serial presence detect, etc.) it should be understood that memory device 210a may be configured (either dynamically or statically) to either retransmit or not retransmit received DQ signals 248 unidirectionally via DQ signals 247 to one or more devices (such as a controller and/or additional DRAM devices) that are disposed in the direction away from the controller. For similar reasons, it should be understood that memory device 210a may be configured dynamically to transmit, via DQ signals 246, data from memory array 229 to one or more devices (such as a controller and/or additional DRAM devices) that are disposed in the direction away from the controller.

FIG. 2B is a block diagram illustrating a buffered DRAM with unidirectional data interfaces and data strobe interface. In FIG. 2B, memory device 210b comprises control 221b, command/address signal (CA) buffers 231, data signal (DQ) buffers 232, DQ buffers 233, memory array 229, DQ multiplexor (MUX) 228, data strobe (DQS) buffer 234, DQS generation 227, and DQS MUX 226. Control 221b is operatively coupled to CA buffers 231, DQ buffers 232, DQ buffers 233, MUX 228, DQS buffer 234, DQS generation 227, memory array 229, and DQS MUX 226 via control signals 222b. Control signals 222b control the operations of CA buffers 231, DQ buffers 232, DQ buffers 233, DQS generation 227, memory array 229, MUX 228, and MUX 226.

MUX 228 is operatively coupled to select between DQ signals 248 and signals from memory array 229 under the control of one or more control signals 222a. The output of MUX 228 is provided to the input of DQ buffers 233. MUX 226 is operatively coupled to select between a DQS signals 244 from an additional device in the additional device direction and an internal to memory device 210b DQS signal from DQS generation 227 under the control of one or more control signals 222*b*. The output of MUX 226 is provided to the input of DQS buffer 234. The output of DQS buffer 234 is provided to one or more device(s) in the direction of the controller.

Thus, it should be understood that memory device 210*b* is substantially the same as memory device 210*a* with the addition of the ability to be configured to retransmit or not retransmit a DQS signal from the additional device direction to the controller direction. Accordingly, control 221*b* is substantially the same as control 221*a* with the addition of circuitry/functionality to control and/or configure DQS buffer 234, DQS MUX 226, and DQS generation 227 via control signals 221*b*. Therefore, it should be understood that control signals 221*b* may be a superset of control signals 221*a*. Because of the similarities between memory device 210*a* and memory device 221*b*, and for the sake of brevity, the function, configuration, and control of CA buffers 231, DQ buffers 232, DQ buffers 232, MUX 228, and memory array 229 will not be repeated here. Reference is made to the discussion of memory device 210*a* as shown in FIG. 2A.

Regarding DQS buffer 234, MUX 226, and DQS generation 227, because DQS buffer 234, and MUX 226 are controlled by control 221*b*, and control 221*b* may be configured by means external to memory device 210*b*, (e.g., via CA signals 241, board connections, serial presence detect, etc.) it should be understood that memory device 210*b* may be configured (either dynamically or statically) to either retransmit or not retransmit received DQS signal 244 unidirectionally via DQS signal 243 to one or more devices (such as a controller and/or additional DRAM devices) that are disposed in the direction towards the controller. For similar reasons, it should be understood that memory device 210*b* may also be configured (either dynamically or statically) to transmit or not transmit, via DQS signals 243, a data strobe timing signal generated by DQS generation 227 to one or more devices (such as a controller and/or additional DRAM devices) that are disposed in the direction toward the controller.

FIGS. 3A-3E are block diagrams illustrating a module with buffered DRAMs. In FIGS. 3A-3E, module 300 comprises memory devices 311-315. Memory devices 311-313 are illustrated as being included in a first rank 305 and memory devices 314-315 are illustrated as being included in a second rank 306. It should be understood that memory devices 311-315 may represent a larger number (e.g., 8, 9, or 10) memory devices that comprise the first rank 305 of memory devices on module 300. Likewise, it should be understood that memory devices 313-314 may represent a larger number (e.g., 8, 9, or 10) memory devices that comprise the second rank 306 of devices on module 300. For the sake of clarity of illustration, the additional devices that comprise the first rank 305 and second rank 306 of memory devices 311-315 on module 300 are not illustrated in FIGS. 3A-3E.

In FIGS. 3A-3E, the first rank 305 receives unidirectional write data signals (WDQ[0:7]) and unidirectional command/address signals (CA[0:4]) from the direction of a memory controller. The first rank 305 also receives unidirectional read data signals (RDQ[0:7]) and (optionally) a unidirectional data strobe (DQS) signal from the second rank 306.

In particular, in FIGS. 3A-3E, each memory device 311-313 in the first rank 305 receives command/address signals CA[0:4] from the direction of the controller. In FIGS. 3A-3E, memory device 313, that is farthest (electrically) from the controller in the first rank, may, under the control of control circuitry 333, retransmit the command/address signals CA[0:4] to the memory devices 314-315 in the second rank 306.

In an embodiment, the retransmission of command/address signals (CA[0:4]), write data signals (WDQ[0:7]), read data signals (RDQ[0:7]), and optionally a data strobe signal (DQS) by one or more devices 311-313 of the first rank 305 may be configured to occur only during accesses to the second rank 306. For example, a write access to the first rank 305 may not result in the write data WDQ[0:7] being retransmitted to the second rank 306. Similarly, for example, a read access to the first rank 305 would similarly not result in read data RDQ[0:7] from the second rank 306 (or strobe DQS) being retransmitted by the devices of the first rank 305. However, for example, a write access to the second rank 306 can result in the write data WDQ[0:7] being retransmitted by the first rank 305. Similarly, for example, a read access to the second rank 306 would similarly result in read data RDQ[0:7] from the second rank 306 (or strobe DQS) being retransmitted by the devices of the first rank 305.

In FIGS. 3A-3E an example number of CA signals equal to five (5) is illustrated. It should be understood that this number is merely for illustration purposes. Other numbers (e.g., 4, 10, 12, etc.) are contemplated.

In FIGS. 3A-3E, the first rank 305 receives unidirectional write data signals (WDQ[0:7]). In particular, in FIGS. 3A-3E, the memory device 311, that is the closest (electrically) memory device in the first rank 305 to the controller receives a subset of write data signals WDQ[0:1] and may, under the control of control circuitry 321, retransmit the subset of WDQ[0:1] signals to memory device 314 that is the closest (electrically) memory device in the second rank 306 to the controller. Memory device 312 that is the second closest (electrically) memory device in the first rank 305 to the controller receives a subset of write data signals WDQ[2:3] and may, under the control of control circuitry 322, retransmit the subset of WDQ[2:3] signals to memory device 315 that is the second closest (electrically) memory device in the second rank 306 to the controller. This pattern of retransmission of proper subsets of WDQ signals by a given memory device 311-313 in the first rank 305 to a corresponding memory device in the second rank 306 may be repeated for all of the devices in the first rank 305 and the second rank 306.

In FIGS. 3A-3E an example number of WDQ signals equal to eight (8) is illustrated. It should be understood that this number is merely for illustration purposes. Other numbers (e.g., 4, 16, etc.) are contemplated. Likewise, in FIGS. 3A-3E an example number of WDQ signals retransmitted by the memory devices 311-313 in the first rank 305 equal to two (8) is illustrated. It should be understood that this number is merely for illustration purposes. Other numbers (e.g., 1, 4, 8, etc.) are contemplated.

In FIGS. 3A-3E, the first rank 305 receives unidirectional read data signals (RDQ[0:7]) from the direction of the second rank 306. In particular, in FIGS. 3A-3E, the memory device 311, that is the closest (electrically) memory device in the first rank 305 to the controller receives a subset of read data signals RDQ[0:1] from memory device 314 that is the closest (electrically) memory device in the second rank 306 to the controller and may, under the control of control circuitry 321, retransmit the subset of RDQ[0:1] signals in the direction of the controller. The memory device 312, that is the second closest (electrically) memory device in the first rank 305 to the controller receives a subset of read data signals RDQ[2:3] from memory device 315 that is the second closest (electrically) memory device in the second rank 306 to the controller and may, under the control of control circuitry 322, retransmit the subset of RDQ[2:3] signals in the direction of the controller This pattern of retransmission of proper subsets of RDQ signals received from a given memory device in the second rank 306 by a corresponding memory device 311-313 in the first rank 305 may be repeated for all of the devices in the first rank 305 and the second rank 306.

In FIGS. 3A-3E an example number of RDQ signals equal to eight (8) is illustrated. It should be understood that this number is merely for illustration purposes. Other numbers (e.g., 4, 16, etc.) are contemplated. Likewise, in FIGS. 3A-3E an example number of RDQ signals retransmitted by the memory devices 311-313 in the first rank 305 equal to two (8) is illustrated. It should be understood that this number is merely for illustration purposes. Other numbers (e.g., 1, 4, 8, etc.) are contemplated.

In FIGS. 3A-3E, the first rank 305 (optionally) receives a unidirectional data strobe signal (DQS) from the direction of the second rank 306. In particular, in FIGS. 3A-3E, the memory device 311, that is the closest (electrically) memory device in the first rank 305 to the controller receives a DQS signal from memory device 314 that is the closest (electrically) memory device in the second rank 306 to the controller and may, under the control of control circuitry 321, retransmit the DQS signal in the direction of the controller.

In FIGS. 3A-3E an example selection of memory device 314 to generate (under the control of control circuity 334) a data strobe signal DQS for the second rank 306 is illustrated. It should be understood that this selection is merely for illustration purposes. It is contemplated that one or more other memory device 314-315 in the second rank 306 may be selected to generate the DQS signal. Likewise, in FIGS. 3A-3E an example selection of memory device 311 in the first rank 305 to retransmit the DQS signal from the second rank 306 is illustrated. It should be understood that this selection is merely for illustration purposes. It is contemplated that other memory device 311-313 in the first rank 305 may be selected to retransmit the DQS signal received from the second rank 306.

Figure 3A:
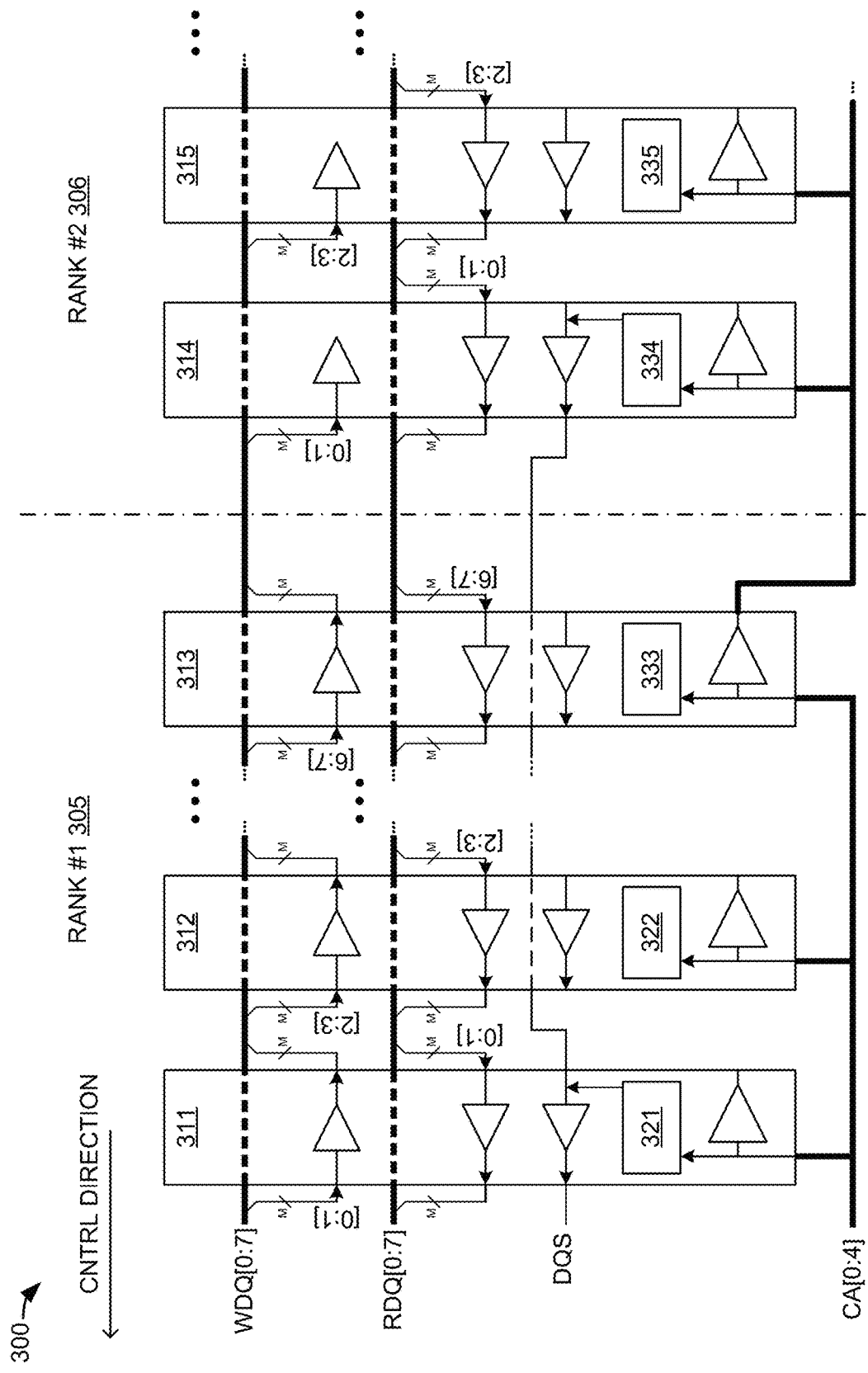
FIGS. 3A-3E are block diagrams illustrating a module with buffered DRAMs.
Figure 3B:
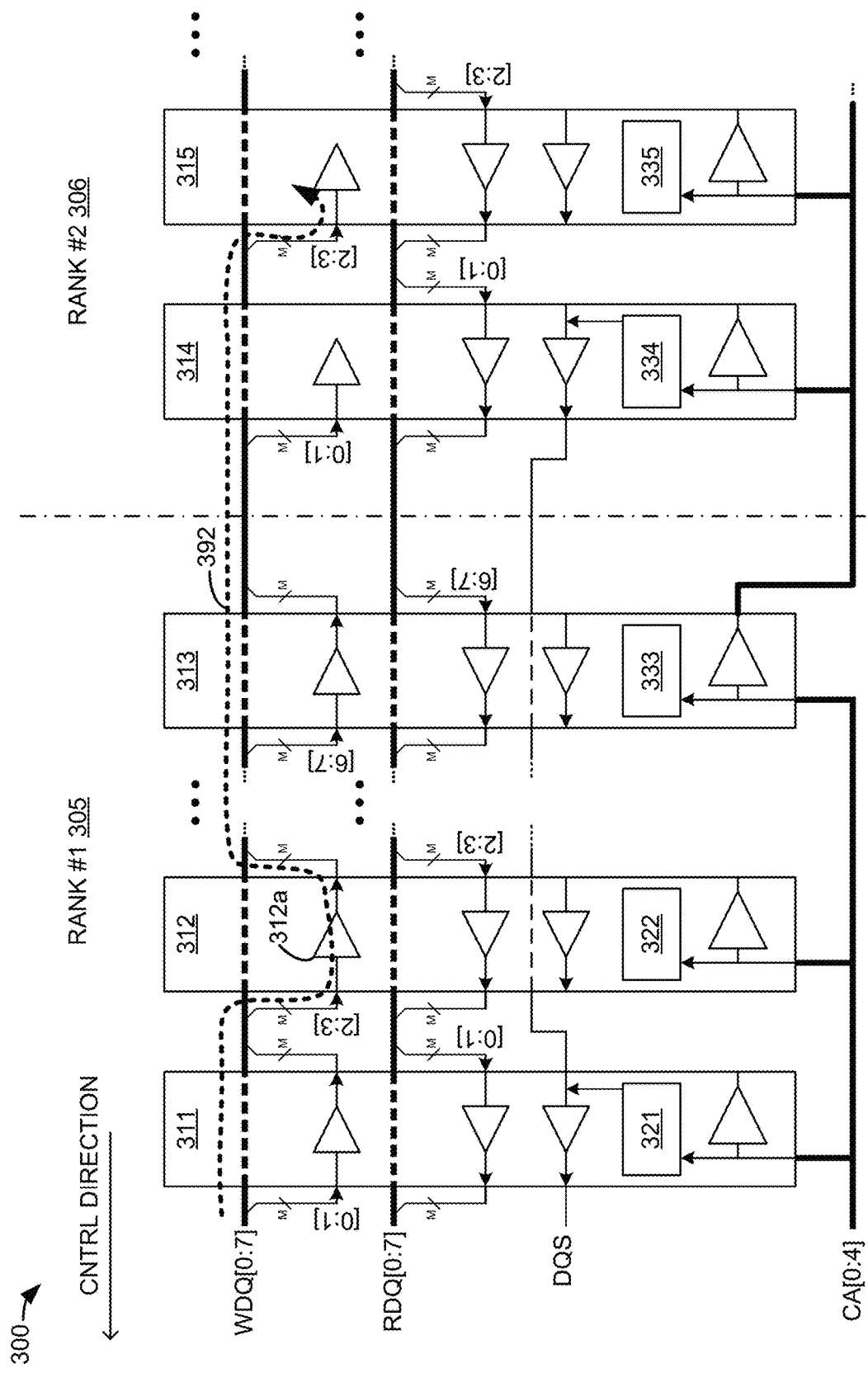

FIG. 3B illustrates the retransmission of a proper subset of write data signals. In FIG. 3B, under the control of control circuitry 322, memory device 312 retransmits WDQ signals [2:3] to memory device 315. This is illustrated in FIG. 3B by arrow 392 running from the direction of the controller to buffers 312a in memory device 312 to memory device 315. It should be noted that WDQ signals [2:3] are not received or retransmitted by memory devices 311, 313, or 314. This is illustrated in FIG. 3B by arrow 392 not routing through the buffers of any of memory devices 311, 313, or 314.

Figure 3C:
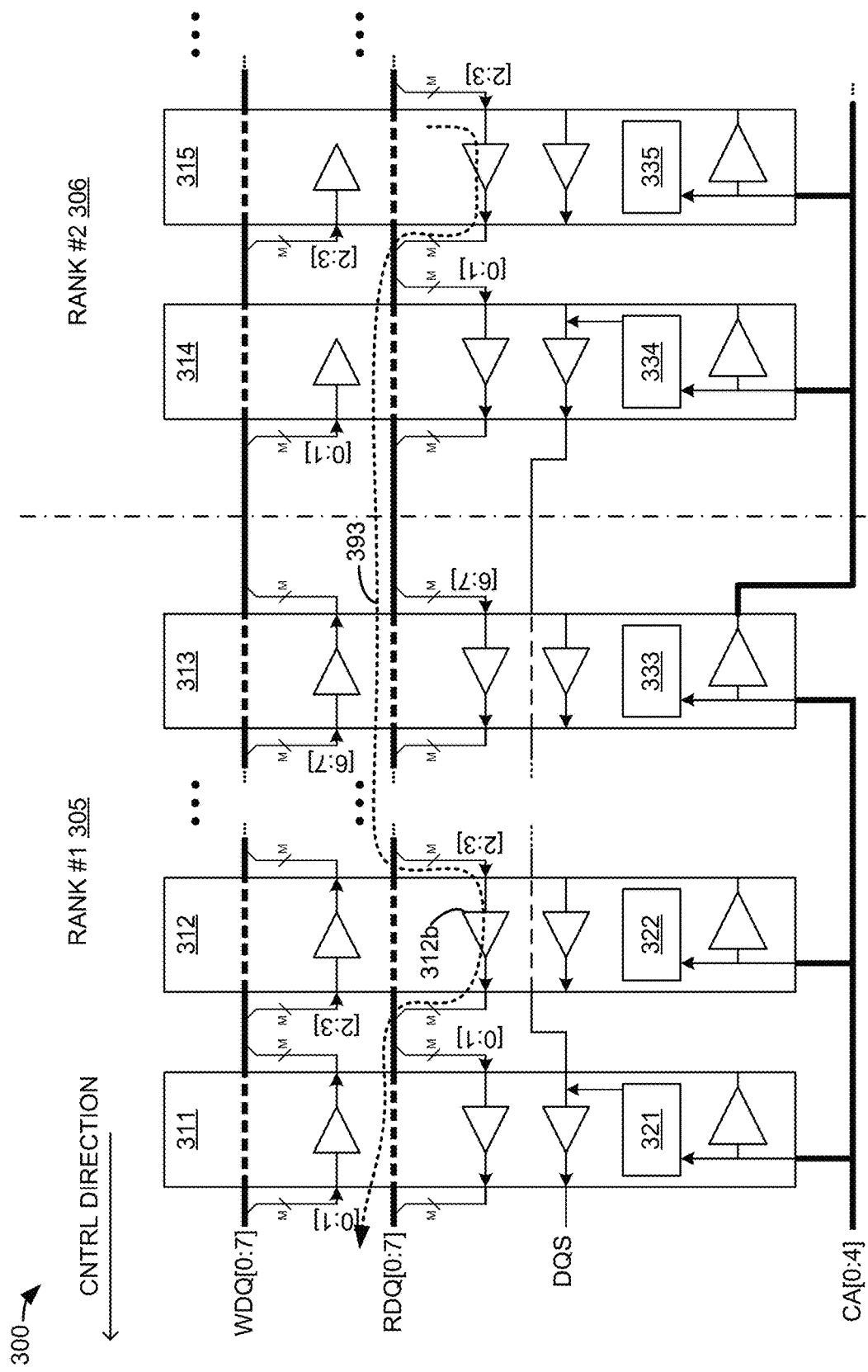

FIG. 3C illustrates the retransmission of a proper subset of read data signals. In FIG. 3C, under the control of control circuitry 322, memory device 312 retransmits RDQ signals [2:3] from memory device 315. This is illustrated in FIG. 3C by arrow 393 running from memory device 315, through buffers 312b of memory device 312, to the direction of the controller. It should be noted that RDQ signals [2:3] are not received or retransmitted by memory devices 311, 313, or 314. This is illustrated in FIG. 3C by arrow 392 not routing through the buffers of any of memory devices 311, 313, or 314.

Figure 3D:
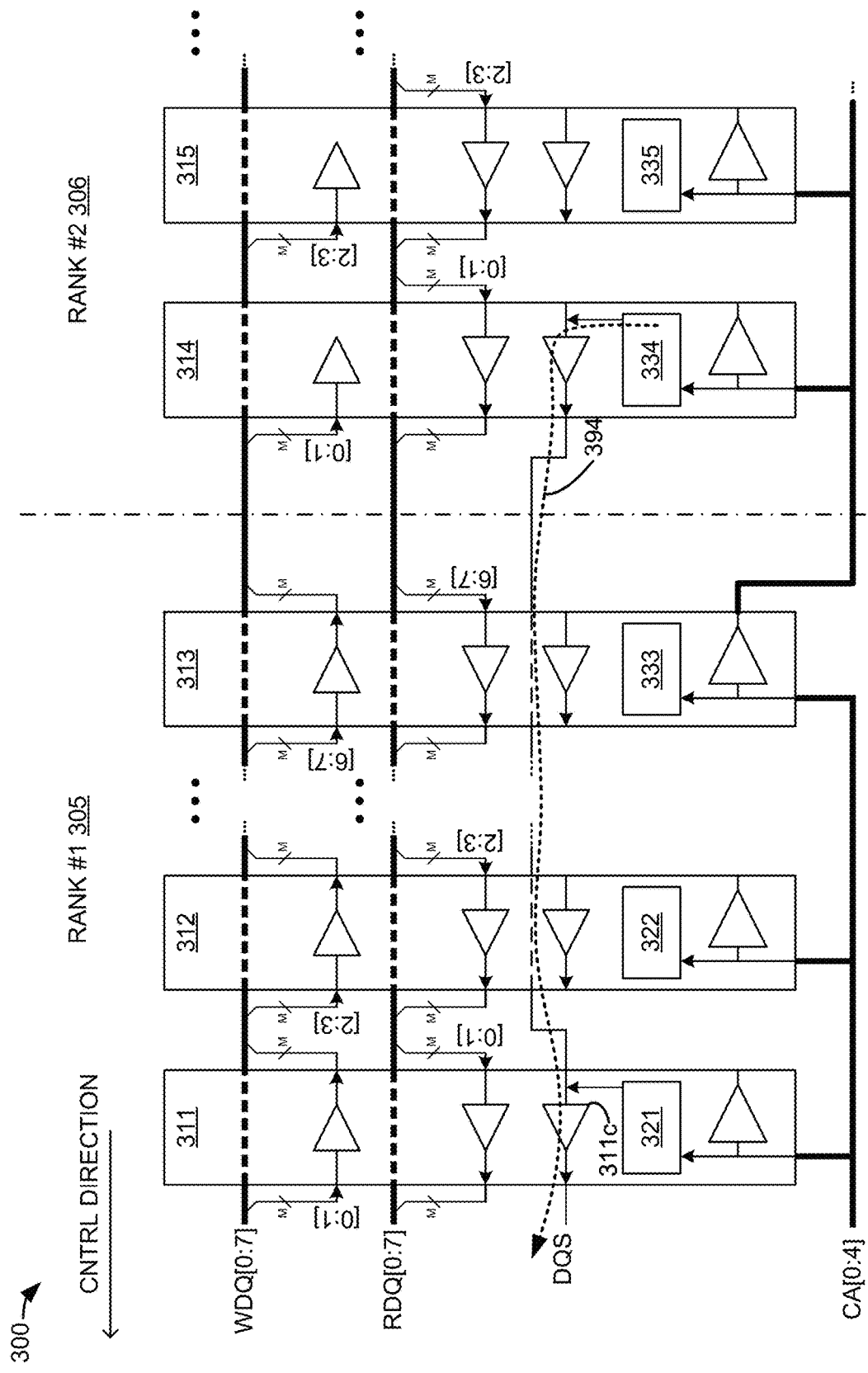

FIG. 3D illustrates the retransmission of a read data strobe signal. In FIG. 3D, under the control of control circuitry 321, memory device 311 retransmits a DQS signal from memory device 314. This is illustrated in FIG. 3D by arrow 394 running from control circuitry 334 of memory device 314, through buffers 311c of memory device 311, to the direction of the controller. It should be noted that the DQS is not received or retransmitted by memory devices 312, 313, or 314. This is illustrated in FIG. 3D by arrow 394 not routing through the buffers of any of memory devices 312, 313, or 314.

Figure 3E:
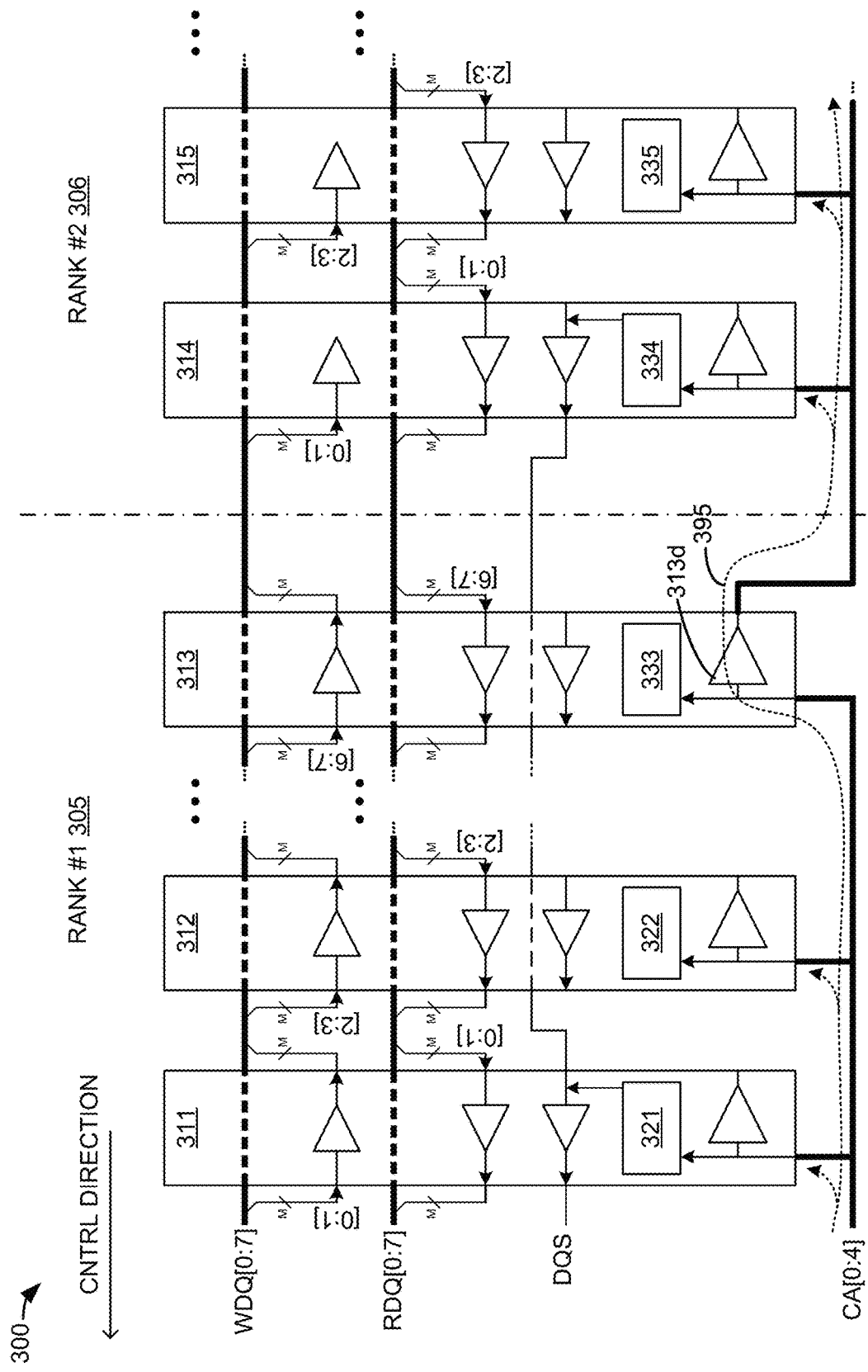

FIG. 3E illustrates the retransmission of a command/address signals. In FIG. 3E, under the control of control circuitry 333, memory device 313 retransmits CA[0:4] signals to the second rank 306 of memory device 314-315. This is illustrated in FIG. 3E by arrow 395. running from the direction of the controller to buffers 313d in memory device 313 to the devices of the second rank 306. It should be noted that CA[0:4] are received, but not retransmitted, by memory devices 311, 312, 314, or 315. This is illustrated in FIG. 3E by arrow 395 not routing through the buffers of any of memory devices memory devices 311, 312, 314, or 315.

In various embodiments, the DRAM devices on a module may be individually configured to conditionally (e.g., depending upon which rank 305-306 is being accessed) retransmit or not retransmit zero or more of command/address signals, write data signals, read data signals, and/or data strobe signals. In an example, the configuration of the DRAM to retransmit or not retransmit signals may be determined by the DRAM device's physical location on a module through the use of, for example, statically or dynamically forcing one or more (package) pins to a selected logic voltage level. In another example, a controller or host may configure the DRAM devices on a module using command/address signals and/or a side-channel (e.g., serial presence detect) to set values in one or more configuration registers. Table 1 illustrates an example set of configurations for devices on a module.

TABLE 1

| Config. | DQ-CFG | DQS-CFG | CA-CFG | DQout | DQSo | CAo/CKo | DQSi |
|---|---|---|---|---|---|---|---|
| A | 1 | 0 | 0 | Enabled | Disabled | Disabled | Disabled |
| B | 1 | 1 | 0 | Enabled | Enabled | Disabled | Enabled |
| C | 1 | 0 | 1 | Enabled | Disabled | Enabled | Disabled |
| D | 0 | 0 | 0 | Disabled | Disabled | Disabled | Disabled |
| E | 0 | 1 | 0 | Disabled | Enabled | Disabled | Disabled |
| F | 1 | 1 | 1 | Enabled | Enabled | Enabled | Enabled |

In Table 1, the example configuration bits DQ-CFG, DQS-CFG, and CA-CFG control the configuration of the retransmission of data signals (e.g., DQ[ ], WDQ[ ], and RDQ[ ]), data strobe signal (e.g., DQS), and command/address signals (e.g., CA[ ]). Thus, for example, when the DQ-CFG bit is a logical '1', the retransmission of WDQ[ ] signals (e.g., by buffers 232) and RDQ[ ] signals (e.g., by buffers 233) is enabled. Example configuration bits DQ-CFG, DQS-CFG, and/or CA-CFG may correspond to package pins that are hardwired or forced (e.g., during reset, etc.) to the logic values given in Table 1.

Figure 4A:
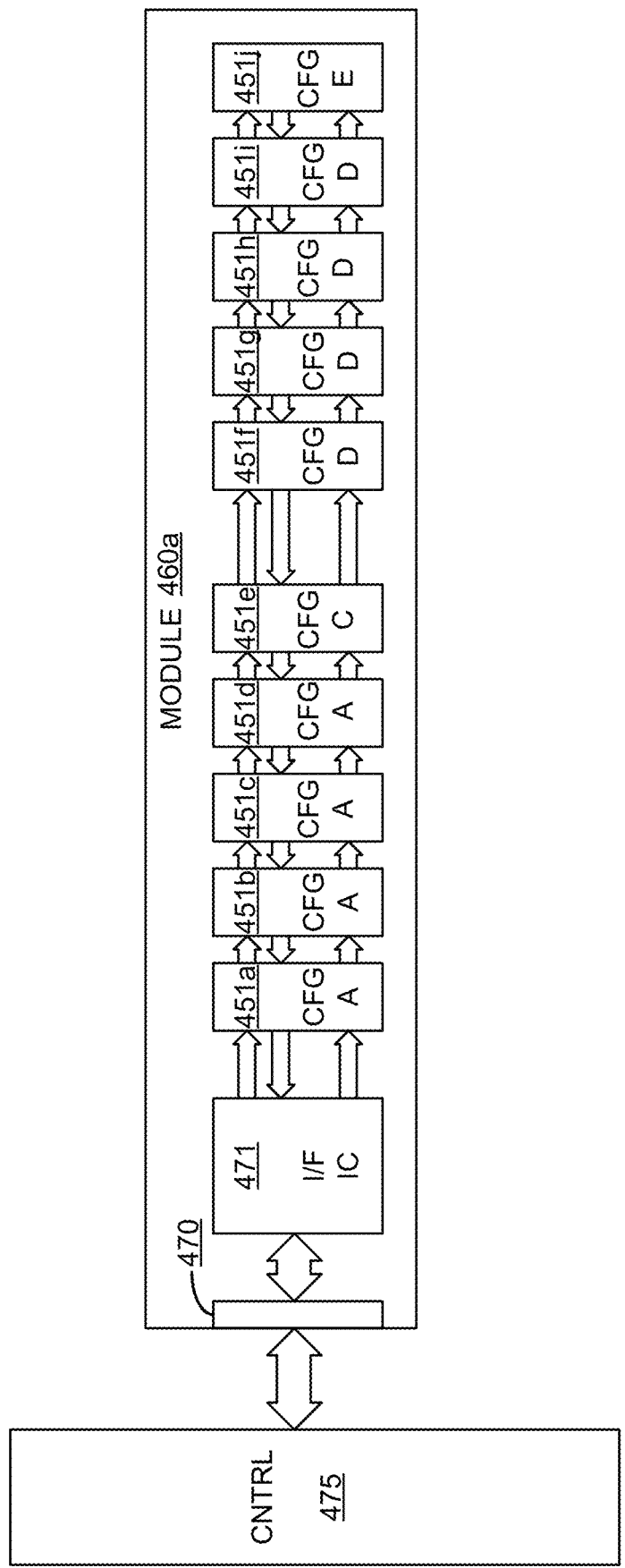
FIGS. 4A-4C are block diagrams illustrating buffered DRAM configurations on a long narrow module form factor.
Figure 4B:
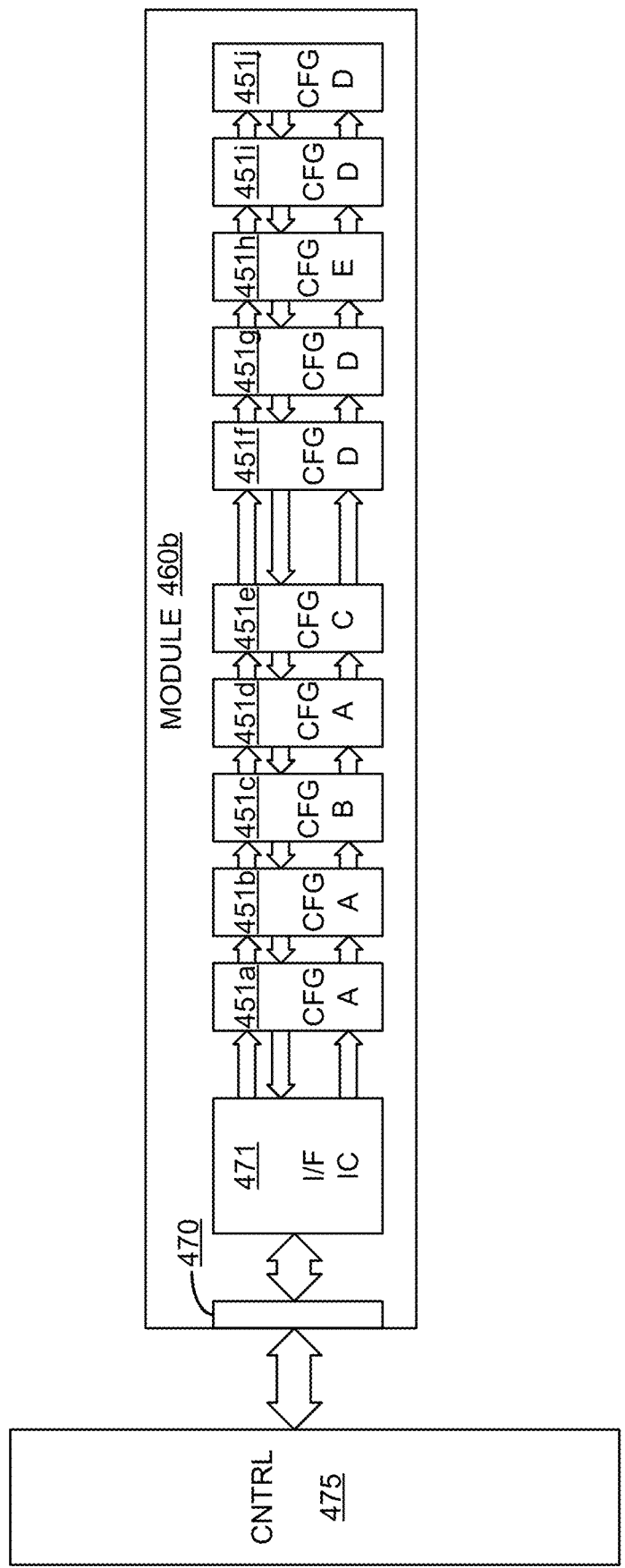
Figure 4C:
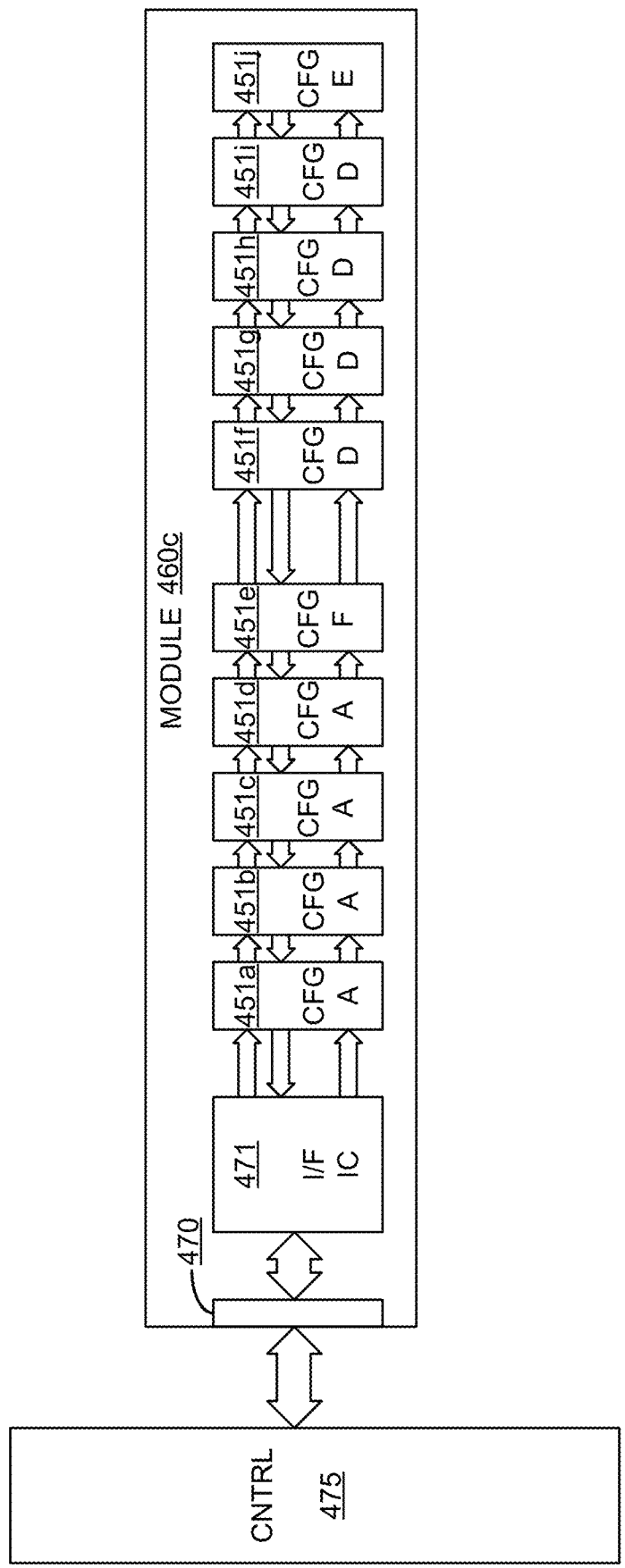

FIGS. 4A-4C are block diagrams illustrating buffered DRAM configurations on a long narrow module form factor. In FIGS. 4A-4C, a controller 475 is operatively coupled to an interface 470 of a module 460a-460c. Interface 470 may be based on, for example, a wide (e.g., ~228 pin) interface similar in character to double data rate DRAM modules (e.g., DDR, DDR4, DDR5, GDDR5, GDDR5, etc.) In another example, interface 470 may be similar to a narrow serial link based protocol (e.g., PCIe, etc.)

An interface integrated circuit device 471 is operatively coupled to a first rank of memory devices 451a-451e. In an embodiment, interface integrated circuit 471 may translate between, for example, the interface(s) used by memory devices 451a-451j and the interface/protocol used by interface 470 (e.g., DDR, PCIe, etc.) to communicate with controller 475.

The first rank of memory devices 451a-451e is operatively coupled to a second rank of memory devices 451f-451j. The individual devices of the first rank of memory devices 451a-451e may be operatively coupled to the second rank of memory devices 451f-451j to retransmit command/address signals (e.g., CA[ ]), unidirectional write data signals (e.g., WDQ[ ]), unidirectional read data signals (e.g., RDQ[ ]) and/or a data strobe signal (e.g., DQS) according to the configuration of the individual memory devices 451a-451j. The configurations in FIGS. 4A-4C are referenced to the example configurations given in Table 1. It should be understood that the example configurations illustrated in FIGS. 4A-4C show unidirectional read data (e.g., RDQ[ ]), write data (e.g., WDQ[ ]), and strobe (e.g., DQS) communication. However, bidirectional (e.g., DQ[ ] of FIG. 1) data communication scheme(s) are also contemplated.

FIG. 4A illustrates a first example configuration of individual memory devices. In FIG. 4A, system 401 includes, on module 460a, memory devices 451a-451d in configuration A, memory device 451e in configuration C, memory devices 451f-451i in configuration D, and memory device 451j in configuration E. Thus, memory devices 451a-451d are configured to conditionally retransmit the write data signals and the read data signals but not to retransmit the data strobe signal and the command/address signals. Memory device 451e retransmit the write data signals, the read data signals and the command/address signals but does not retransmit the data strobe signal. Memory devices 451f-451i do not retransmit any of the write data signals, the read data signals, the command/address signals, and the data strobe signal. Memory device 451j does not retransmit any of the write data signals, the read data signals, the command/address signals, and the data strobe signal but does internally generate and transmit a DQS signal in the direction of the controller 475.

FIG. 4B illustrates a second example configuration of individual memory devices. In FIG. 4B, system 402 includes, on module 460b, memory devices 451a-451b, and 451d in configuration A, memory device 451c in configuration B, memory device 451e in configuration C, memory devices 451f-451g, and 451i-451j in configuration D, and memory device 451h in configuration E. Thus, memory devices 451a-451b, and 451d retransmit the write data signals and the read data signals but do not retransmit the data strobe signal and the command/address signals. Memory device 451c retransmits the write data signals, the read data signals and the data strobe signal but does not retransmit the command/address signals. Memory device 451e retransmits the write data signals, the read data signals and the command/address signals but does not retransmit the data strobe signal. Memory devices 451f-451g, and 451i-451j do not retransmit any of the write data signals, the read data signals, the command/address signals, and the data strobe signal. Memory device 451h does not retransmit any of the write data signals, the read data signals, the command/address signals, and the data strobe signal but does internally generate and transmit a DQS signal in the direction of the controller 475.

FIG. 4C illustrates a third example configuration of individual memory devices. In FIG. 4C, system 403 includes, on memory devices 451a-451d in configuration A, memory device 451e in configuration F, memory devices 451f-451i in configuration D, and memory device 451j in configuration E. Thus, memory devices 451a-451d retransmit the write data signals and the read data signals but do not retransmit the data strobe signal and the command/address signals. Memory device 451e retransmit the write data signals, the read data signals, the command/address signals, and the data strobe signal. Memory devices 451f-451i do not retransmit any of the write data signals, the read data signals, the command/address signals, and the data strobe signal. Memory device 451j does not retransmit any of the write data signals, the read data signals, the command/address signals, and the data strobe signal but does internally generate and transmit a DQS signal in the direction of the controller 475.

It should be understood that the configurations illustrated in FIGS. 4A-4C are examples. Other configurations among the memory devices 451a-451j on a module are contemplated. For example, other memory device(s) may retransmit the data strobe signal that were not shown in FIGS. 4A-4C as retransmitting the data strobe signal. Due to the large number of possible combinations and/or permutations, these further example configurations are not discussed and/or illustrated herein for the sake of brevity.

Figure 5A:
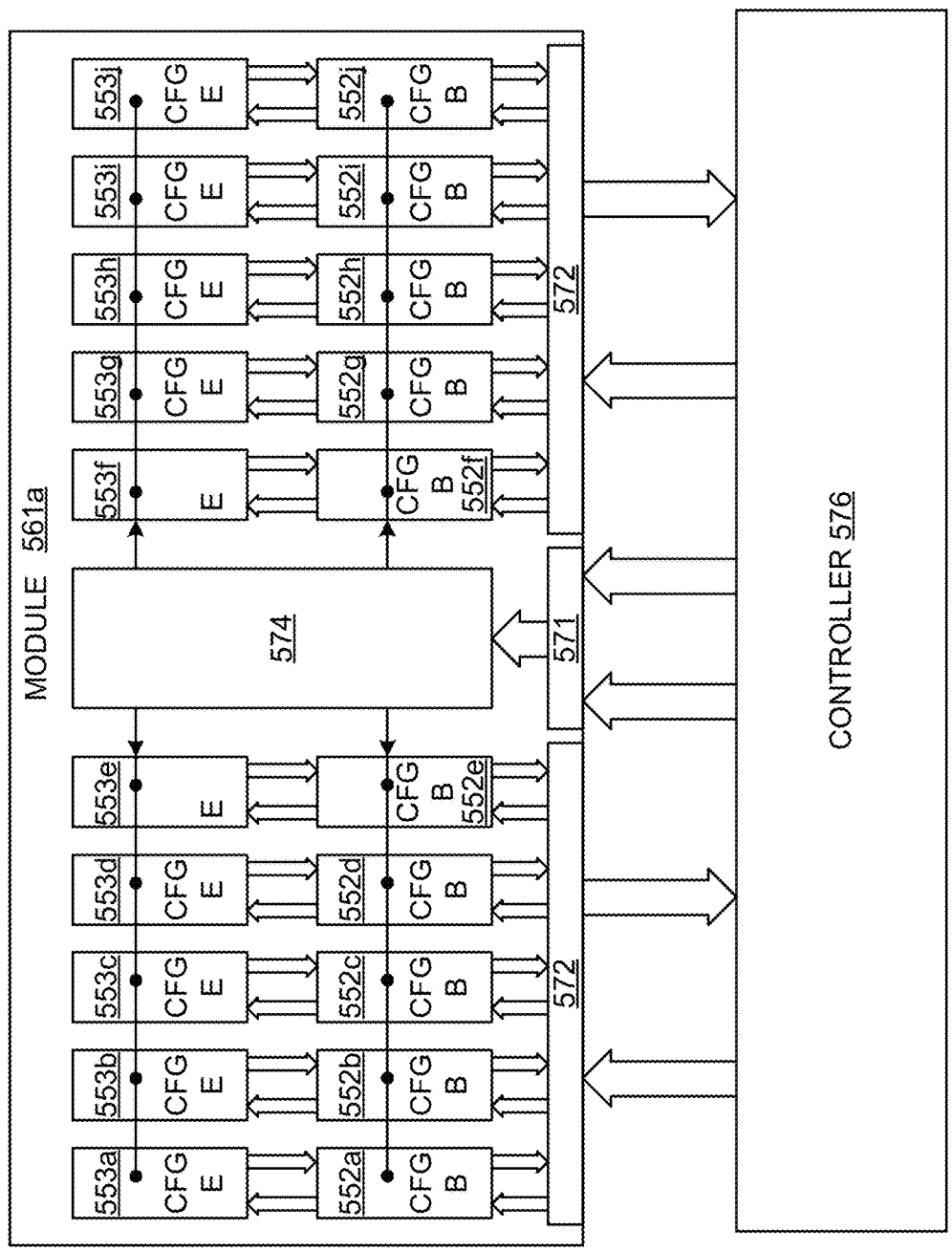
FIGS. 5A-5B are block diagrams illustrating buffered DRAM configurations on a dual-inline memory module (DIMM) form factor.
Figure 5B:
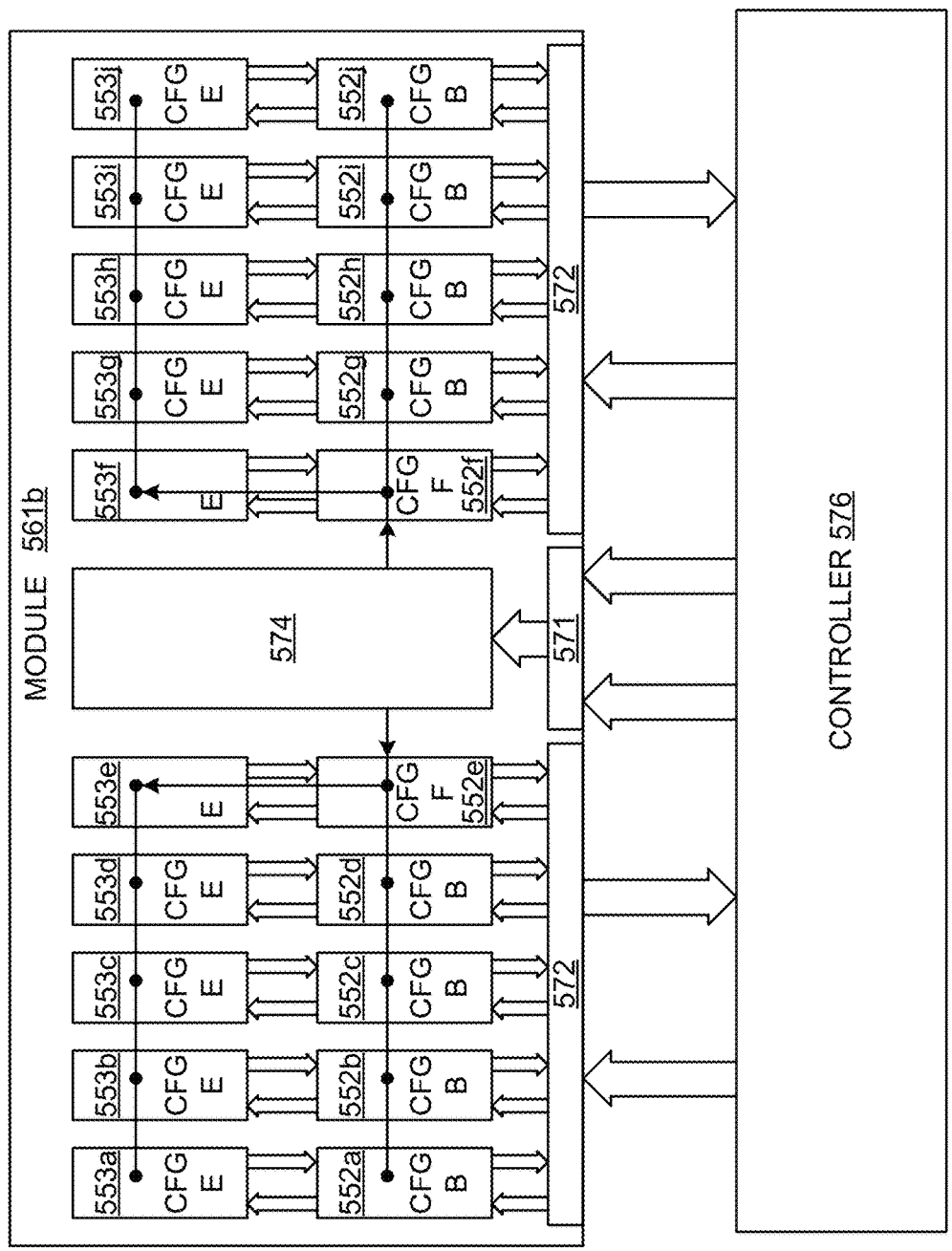

FIGS. 5A-5B are block diagrams illustrating buffered DRAM configurations on a dual-inline memory module (DIMM) form factor. In FIGS. 5A-5B, a controller 576 is operatively coupled to the command/address interfaces 571 and the data interfaces 572 of modules 561a-561b. A first rank of memory devices 552a-552j is operatively coupled to a second rank of memory devices 553a-553j. The individual devices of the first rank of memory devices 552a-552j may be operatively coupled to the second rank of memory devices 553a-553j to retransmit command/address signals (e.g., CA[ ]), unidirectional write data signals (e.g., WDQ[ ]), unidirectional read data signals (e.g., RDQ[ ]) and/or a data strobe signal (e.g., DQS) according to the configuration of the individual memory devices 552a-552j. The configurations in FIGS. 5A-5B are referenced to the example configurations given in Table 1. It should be understood that the example configurations illustrated in FIGS. 5A-5B show unidirectional read data (e.g., RDQ[ ]), write data (e.g., WDQ[ ]), and strobe (e.g., DQS) communication. However, bidirectional (e.g., DQ[ ] of FIG. 1) data communication scheme(s) are also contemplated.

In system 501 of FIG. 5A, a registered clock driver (RCD) 574 is operatively coupled to the CA signal inputs of the first rank of memory devices 552a-552j and the second rank of memory devices 553a-553j. Registered clock driver 574 is operatively coupled to the first rank of memory devices 552a-552j and the second rank of memory devices 553a-553j to drive command/address signals received via command/address interface 571 to the first rank of memory devices 552a-552j and the second rank of memory devices 553a-553j via separate CA signal busses. In other words, RCD 574 drives CA signals to memory devices 552*a*-552*e* via a first bus; drives CA signals to memory devices 552*f*-552*j* via a second bus; drives CA signals to memory device 553*a*-553*e* via a third bus; and, drives CA signals to memory device 553*f*-553*j* via a fourth bus.

In system 501, memory devices 552*a*-552*j* are in configuration B, and memory devices 553*a*-553*j* are in configuration E. Thus, memory devices 552*a*-552*j* retransmit the write data signals and the read data signals and the data strobe signal to/from memory devices 553*a*-553*j* but do not retransmit the command/address signals. Memory devices 553*a*-553*j* do not retransmit any of the write data signals, the read data signals, the command/address signals, and the data strobe signal.

In system 502 of FIG. 5B, a registered clock driver (RCD) 574 is operatively coupled to the first CA inputs of the first rank of memory devices 552*a*-552*j*. The CA inputs of the left-hand (in FIG. 5B) memory devices 553*a*-553*e* of the second rank of memory devices 553*a*-553*j* are operatively coupled to RCD 574 via memory device 552*e*. The CA inputs of the right-hand (in FIG. 5B) memory devices 553*f*-553*j* of the second rank of memory devices 553*a*-553*j* are operatively coupled to RCD 574 via memory device 552*f*. Registered clock driver 574 is operatively coupled to the first rank of memory devices 552*a*-552*j* and the second rank of memory devices 553*a*-553*j* to drive command/address signals received via command/address interface 571 to the first rank of memory devices 552*a*-552*j* and the second rank of memory devices 553*a*-553*j*. In other words, RCD 574 drives CA signals to memory devices 552*a*-552*e* via a first bus; drives CA signals to memory devices 552*f*-552*j* via a second bus; drives CA signals to memory device 553*a*-553*e* via memory device 552*e* and a third bus; and, drives CA signals to memory device 553*f*-553*j* via memory device 552*f* and a fourth bus.

In system 502, memory devices 552*a*-552*d* and 552*g*-552*j* are in configuration B, memory devices 553*a*-553*j* are in configuration E, and memory devices 552*e*-552*f* are in configuration F. Thus, memory devices 552*a*-552*d* and 552*g*-552*j* retransmit the write data signals, the read data signals, and the data strobe signal to/from memory devices 553*a*-553*j* but do not retransmit the command/address signals. Memory devices 553*a*-553*j* do not retransmit any of the write data signals, the read data signals, the command/address signals, and the data strobe signal. Memory devices 552*e*-552*f* retransmit the write data signals, the read data signals, the command/address signals, and the data strobe signal In an embodiment, the memory devices described herein may implement a command/address signaling scheme with commands that combine the functionality of read and write commands with the functionality of activate (ACT) and precharge (PRE) commands. Table 2 illustrates an example encoding of a combined write, activate, and precharge command for a 5-bit CA bus by eight (8) time slot command sequence (or packaged/combined command). Table 3 illustrates an example encoding of a combined read, activate, and precharge command for a 5-bit CA bus by eight (8) time slot command sequence. It should be understood that these are merely example encodings and that other commands such as a separate ACT command, burst reads, burst writes, fast page prefetch, etc. may also be encoded using a 5-bit CA bus by eight (8) time slot command sequence. In an embodiment, to perform a burst command, the command/address signals may indicate a burst start and a burst end that are directed to a same row of a DRAM memory array of the DRAM component. In an embodiment, to perform a burst command, the command/address signals may indicate a burst start and a number of column accesses that are directed to a same row of a DRAM memory array of the DRAM component. In an embodiment, the column accesses may begin in the middle of a row and wrap around to the beginning. Table 4 illustrates an example encoding of a burst write command for a 5-bit CA bus by eight (8) time slot command sequence. Table 5 illustrates an example encoding of a burst read command for a 5-bit CA bus by eight (8) time slot command sequence. Table 6 illustrates an example encoding of an activate (ACT) command for a 5-bit CA bus by eight (8) time slot command sequence.

TABLE 2

Combined WR, ACT, and PRE command encoding

| CA Bit 0 | CA Bit 1 | CA Bit 2 | CA Bit 3 | CA Bit 4 |
|---|---|---|---|---|
| H | L | H | H | L |
| CID1 | CID2 | CID3 | BA0 | BA1 |
| CID0 | BG0 | BG1 | BG2 | R13 |
| R14 | R15 | R16 | R11 | R12 |
| R10 | R9 | R8 | R7 | R6 |
| R1 | R2 | R5 | R4 | R3 |
| RD | V | C3 | C4 | C5 |
| C6 | C7 | C8 | C9 | C10 |

TABLE 3

Combined RD, ACT, and PRE command encoding

| CA Bit 0 | CA Bit 1 | CA Bit 2 | CA Bit 3 | CA Bit 4 |
|---|---|---|---|---|
| H | L | H | H | H |
| CID1 | CID2 | CID3 | BA0 | BA1 |
| CID0 | BG0 | BG1 | BG2 | R13 |
| R14 | R15 | R16 | R11 | R12 |
| R10 | R9 | R8 | R7 | R6 |
| R1 | R2 | R5 | R4 | R3 |
| RD | C2 | C3 | C4 | C5 |
| C6 | C7 | C8 | C9 | C10 |

TABLE 4

Burst write command encoding

| CA Bit 0 | CA Bit 1 | CA Bit 2 | CA Bit 3 | CA Bit 4 |
|---|---|---|---|---|
| H | L | L | L | L |
| CID1 | CID2 | CID3 | BA0 | BA1 |
| CID0 | BG0 | BG1 | BG2 | V |
| V | V | Start C3 | Start C4 | Start C5 |
| Start C6 | Start C7 | Start C8 | Start C9 | Start C10 |
| V | V | V | V | V |
| V | V | End C3 | End C4 | End C5 |
| End C6 | End C7 | End C8 | End C9 | End C10 |

TABLE 5

Burst read command encoding

| CA Bit 0 | CA Bit 1 | CA Bit 2 | CA Bit 3 | CA Bit 4 |
|---|---|---|---|---|
| H | L | L | L | H |
| CID1 | CID2 | CID3 | BA0 | BA1 |
| CID0 | BG0 | BG1 | BG2 | V |
| V | Start C2 | Start C3 | Start C4 | Start C5 |
| Start C6 | Start C7 | Start C8 | Start C9 | Start C10 |
| V | V | V | V | V |
| V | End C2 | End C3 | End C4 | End C5 |
| End C6 | End C7 | End C8 | End C9 | End C10 |

TABLE 6

Activate command encoding

| CA Bit 0 | CA Bit 1 | CA Bit 2 | CA Bit 3 | CA Bit 4 |
|---|---|---|---|---|
| L | L | R0 | R1 | R2 |
| R3 | BA0 | BA1 | BG0 | BG1 |
| BG2 | CID0 | CID1 | CID2 | R4 |
| R5 | R6 | R7 | R8 | R9 |
| R10 | R11 | R12 | R13 | R14 |
| R15 | R16 | CID3 | V | V |
| V | V | V | V | V |
| V | V | V | V | V |

Figure 6:
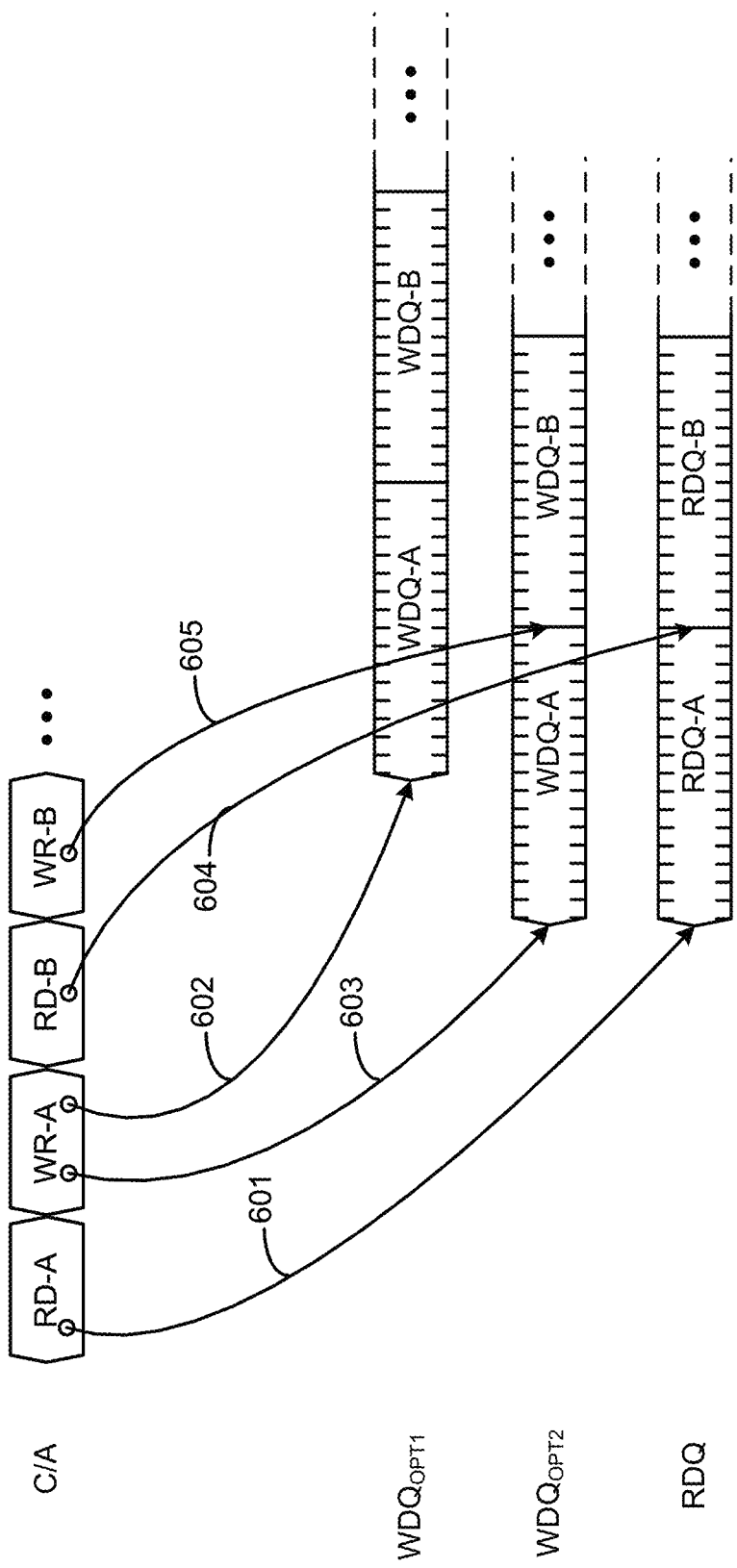
FIG. 6 is a timing diagram illustrating the operation of a buffered DRAM module.

FIG. 6 is a timing diagram illustrating the operation of a buffered DRAM module. The timing illustrated in FIG. 6 corresponds to a CA bus signaling that uses a 5-bit CA bus by eight (8) time slot command sequence. In FIG. 6, a first read command RD-A is issued and takes eight time slots to specify the command and address to be accessed. A read access time later, the data being read by the first read access command is returned by the memory device on the read data bus (RDQ). This is illustrated in FIG. 6 by arrow 601.

Immediately following (e.g., in the next eight time slots) the RD-A command, a first write command WR-A may be issued. In a first example timing (WDQ$_{opt1}$), the first write data is sent to the memory device a write access time following the first WR-A command. This is illustrated in FIG. 6 by the arrow 602. In a second (alternative) example timing (WDQ$_{opt2}$) the first write data is sent to the memory device a write access time following the first WR-A command. This is illustrated in FIG. 6 by the arrow 603. In an embodiment, the write latency is (or is set) to match the read data burst time (or 'slot') of the prior read command.

Immediately following (e.g., in the next eight time slots) the first WR-A command, a second read command RD-B may be issued. A read access time later, the data being read by the second read access command is returned by the memory device on the read data bus (RDQ). This is illustrated in FIG. 6 by arrow 604. Immediately following (e.g., in the next eight time slots) the RD-B command, a second write command WR-B may be issued. For the second example timing (WDQ$_{opt2}$) the second write data may be sent to the memory device a write access time following the second WR-B command that is the same as the read access time. This is illustrated in FIG. 6 by the arrow 605. Note that in these examples the read to read interval and the write to write interval equal the length of (both) the read data transaction time as well as the write transaction time. This results in 100% utilization of the CA, WDQ, and RDQ signal busses when the read and write commands are interleaved and issued back to back.

Figure 7:
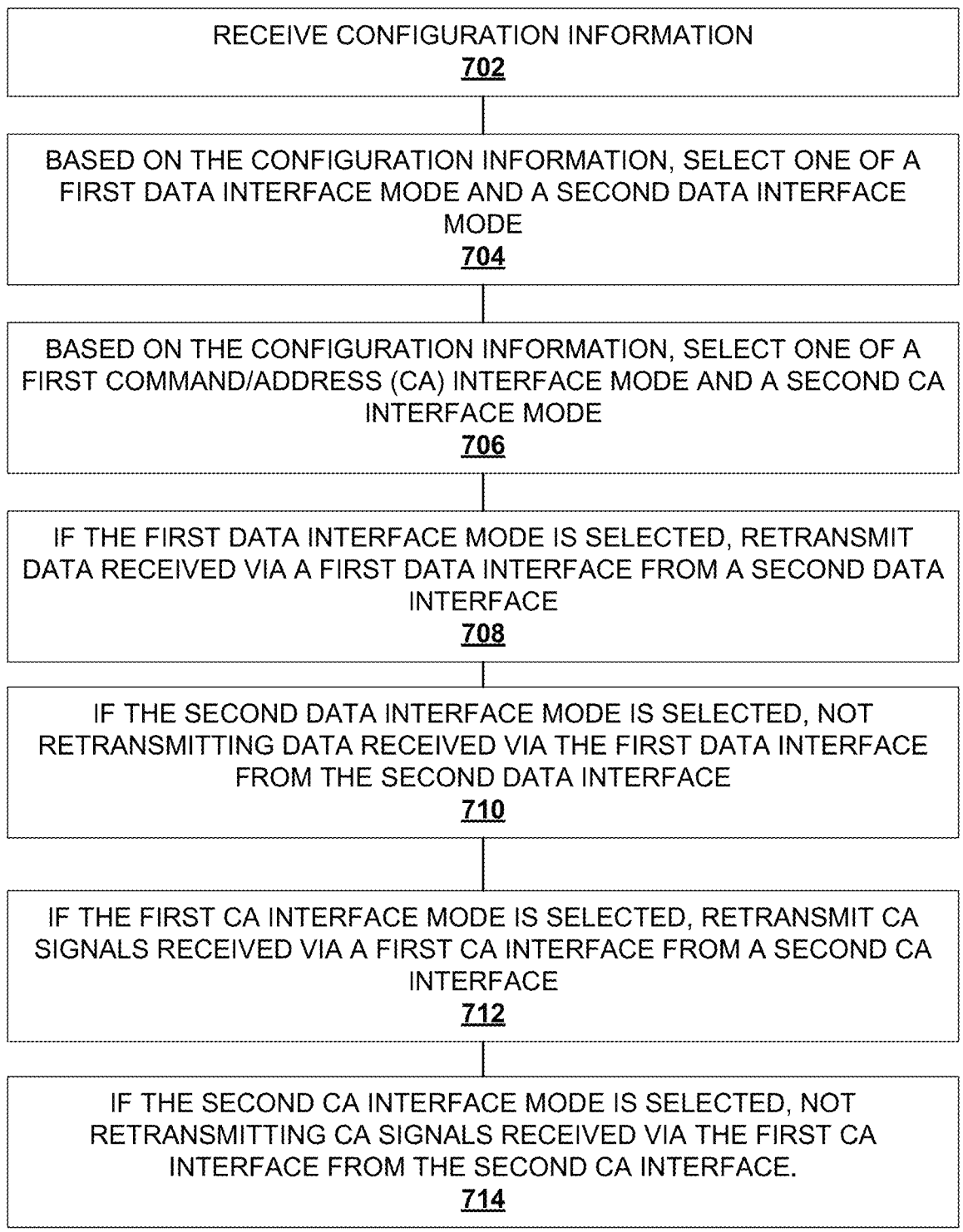
FIG. 7 is a flowchart illustrating the operation of a buffered DRAM device.

FIG. 7 is a flowchart illustrating the operation of a buffered DRAM device. One or more steps illustrated in FIG. 7 may be performed by, for example, memory device 110, memory device 210a, memory device 210b, module 300, system 401, system 402, system 403, system 501, system 502, and/or their components. Configuration information is received (702). For example, memory device 210a may receive configuration information by means external to memory device 210a. For example, one or more of CA signals 241 from a controller, static board connections, forcing of package pins at selected times, serial presence detect, mode register set commands programming registers via the CA and/or DQ signals, etc. may be used to provide memory device 210a with configuration information.

Based on the configuration information, one of a first data interface mode and a second data interface mode is selected (704). For example, based on the configuration information, memory device 210a may select whether to conditionally retransmit or not retransmit (e.g., conditionally based on the rank the access is directed toward) received DQ signals 245 unidirectionally via DQ buffers 232 and DQ signals 246, and whether to retransmit or not retransmit received DQ signals 248 unidirectionally via DQ buffers 233 and DQ signals 247. Based on the configuration information, a one of a first command/address (CA) interface mode and a second CA interface mode is selected (706). For example, based on the configuration information, memory device 210a may select whether to conditionally retransmit or not retransmit received CA signals 241 via CA buffers 231 and CA signals 242.

If the first data interface mode is selected, data received via a first data interface is retransmitted from a second data interface (708). For example, based on the selection of a mode that retransmits received data, memory device 210a may retransmit received DQ signals 245 via DQ buffers 232 and DQ signals 246, and/or retransmit received DQ signals 248 via DQ buffers 233 and DQ signals 247. If the second data interface mode is selected, data received via a first data interface is not retransmitted from a second data interface (710). For example, based on the selection of a mode that does not retransmit received data, memory device 210a does not retransmit received DQ signals 245 via DQ buffers 232 and DQ signals 246, and does not retransmit received DQ signals 248 via DQ buffers 233 and DQ signals 247.

If the first CA interface mode is selected, CA signals received via a first CA interface are retransmitted from a second CA interface (712). For example, based on the selection of a mode that retransmits received CA signals, memory device 210a may retransmit received CA signals 241 via CA buffers 231 and CA signals 242. If the second CA interface mode is selected, CA signals received via a first CA interface are not retransmitted from a second CA interface (712). For example, based on the selection of a mode that does not retransmit received CA signals, memory device 210a does not retransmit received CA signals 241 via CA buffers 231 and CA signals 242.

Figure 8:
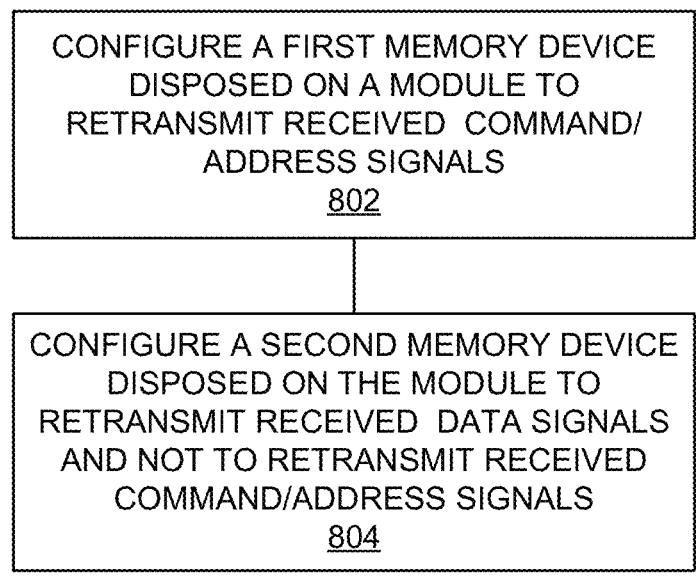
FIG. 8 is a flowchart illustrating a method of configuring a buffered DRAM module.

FIG. 8 is a flowchart illustrating the operation of a buffered DRAM device. One or more steps illustrated in FIG. 8 may be performed by, for example, memory device 110, memory device 210a, memory device 210b, module 300, system 401, system 402, system 403, system 501, system 502, and/or their components. A first memory device disposed on a module is configured to retransmit received command/address signals (802). For example, memory device 451f on module 460a may be configured in configuration C to retransmit received command/address signals.

A second memory device disposed on the module is configured to retransmit received data signals and not retransmit received command/address signals (804). For example, memory device 451a on module 460a may be configured in configuration A to retransmit received data signals and to not retransmit received command/address signals.

Figure 9:
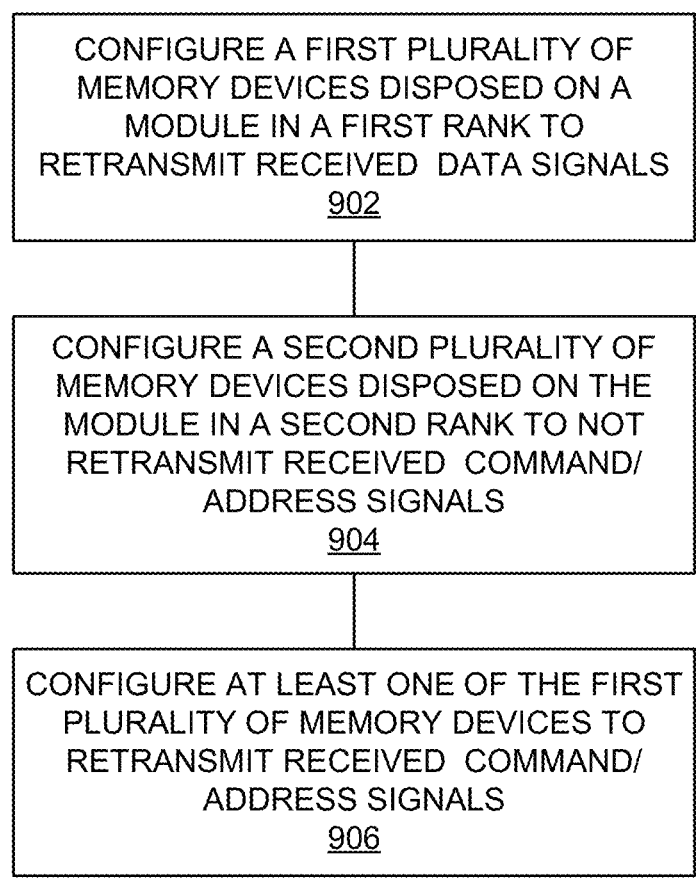
FIG. 9 is a flowchart illustrating a second method of configuring a buffered DRAM module.

FIG. 9 is a flowchart illustrating the operation of a buffered DRAM device. One or more steps illustrated in FIG. 9 may be performed by, for example, memory device 110, memory device 210a, memory device 210b, module 300, system 401, system 402, system 403, system 501, system 502, and/or their components. A first plurality of memory devices disposed on a module in a first rank are configured to retransmit received data signals (902). For example, memory devices 552a-552j that are in a first rank on module 561b may be configured in configuration B or configuration F to retransmit received data signals to memory devices 553a-553j that are in a second rank on module 561b A second plurality of memory devices disposed on the module in a second rank are configured to not to retransmit received command/address signals (904). For example, memory devices 553a-553j that are in a second rank on module 561b may be configured in configuration E to not retransmit received command address signals. At least one of the first plurality of memory devices is configured to retransmit received command/address signals (906). For example, one or more of memory devices 552e-552f may be configured in configuration F to retransmit command/address signals to memory devices 552a-553j in the second rank of module 561b.

Herein, memory devices 110, 210a, 210b, 311-315, 451a-451j, 552a-552j, and 553a-553j have been described as including and/or being DRAM memory core based devices. This was mostly for illustration purposes. Thus, it should be understood that memory devices 110, 210a, 210b, 311-315, 451a-451j, 552a-552j, and/or 553a-553j may be based on and/or include one or more other type(s) of memory cores. For example, static random access memory (SRAM) cores, non-volatile memory cores such as flash (e.g., NAND flash, NOR flash), resistive random access memory (e.g., RRAM, ReRAM) cores, magnetoresistive random-access memory (MRAM) cores, and the like may be included in and/or comprise a substantial majority of memory devices 110, 210a, 210b, 311-315, 451a-451j, 552a-552j, and/or 553a-553j. The devices discussed herein may be interconnected with each other in a variety of system topologies including on a PC board (e.g., where the memory is on a module and the controller is socketed to the PC board, or in "die-down" arrangement where one or both of the chips are soldered to the PC board), stacked one on top of another and encapsulated in a single package or each having separate package (package-on-package), both disposed on a shared substrate, on an interposer, or even in a direct-attach arrangement.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory device 110, memory device 210a, memory device 210b, module 300, system 401, system 402, system 403, system 501, system 502, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
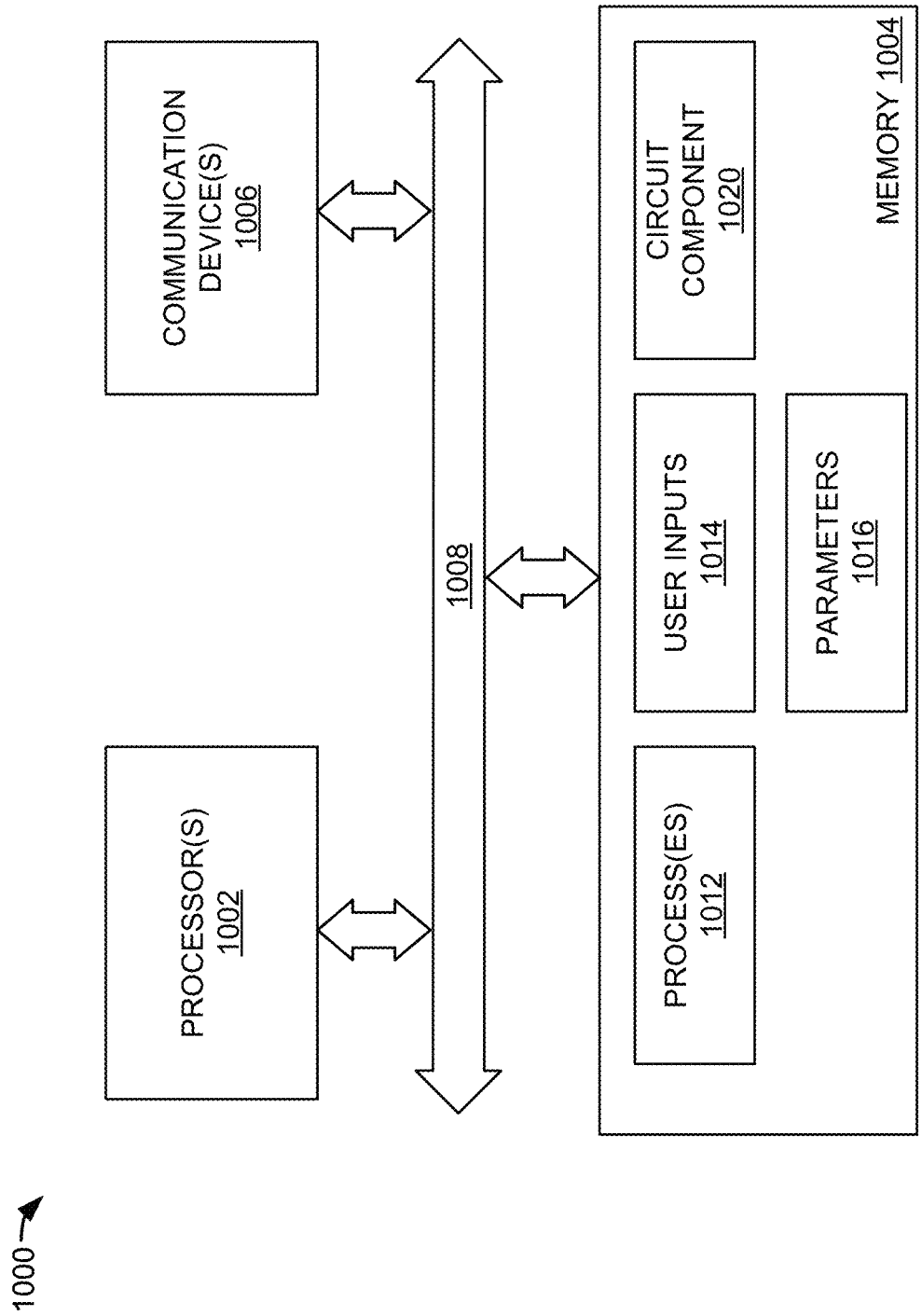
FIG. 10 is a block diagram of a processing system.

FIG. 10 is a block diagram illustrating one embodiment of a processing system 1000 for including, processing, or generating, a representation of a circuit component 1020. Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of memory device 110, memory device 210a, memory device 210b, module 300, system 401, system 402, system 403, system 501, system 502, and their components, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

Implementations discussed herein include, but are not limited to, the following examples:

Example 1: A DRAM component, comprising: a first interface to receive first data to be written to a first DRAM memory array and second data retrieved from a second DRAM memory array; a second interface to receive command/address signals; the first interface configurable to retransmit zero or more of the first data and the second data and configurable to not retransmit zero or more of the first data and the second data; and, the second interface configurable to retransmit the command/address signals and configurable to not retransmit the command/address signals.

Example 2: The DRAM component of example 1, wherein the first interface includes a first unidirectional signal group to receive the first data and a second unidirectional signal group to retransmit the first data and a third unidirectional signal group to receive the second data and a fourth unidirectional signal group to retransmit the second data.

Example 3: The DRAM component of example 1, further comprising: a third interface to receive information used to determine whether the first interface is configured to retransmit zero or more of the first data and the second data and to determine whether the first interface is configured not to retransmit zero or more of the first data and the second data, the information to also determine whether the second interface is configured to retransmit the command/address signals and to determine whether the second interface is configured to not retransmit the command/address signals.

Example 4: The DRAM component of example 1, wherein the DRAM component is to perform a combined activate (ACT) and read (RD) command received via the command/address signals and is to perform a combined activate (ACT) and write (WR) command received via the command/address signals.

Example 5: The DRAM component of example 1, wherein the DRAM component is to perform a burst command received via the command/address signals that indicates a burst start and a burst end that are directed to a same row of a DRAM memory array of the DRAM component.

Example 6: The DRAM component of example 1, further comprising: a third interface to transmit a first timing reference signal for a synchronous reception of data transmitted by the first interface.

Example 7: The DRAM component of example 6, wherein the first timing reference signal is a retransmitted version of a second timing reference signal received from another DRAM component.

Example 8: The DRAM component of example 1, wherein the first interface communicates error correction and detection information, and the second interface communicates error detection information.

Example 9: A DRAM memory device, comprising: a data interface to receive data signals; a command/address interface to receive command/address signals; and, the data interface configurable, in a first data (DQ) interface mode, to retransmit received data signals, the command/address (CA) interface configurable, in a first CA interface mode, to retransmit received command/address signals.

Example 10: The DRAM memory device of example 9, wherein the data interface is configurable, in a second DQ interface mode, to not retransmit received data signals.

Example 11: The DRAM memory device of example 9, wherein the CA interface is configurable, in a second CA interface mode, to not retransmit received command/address signals.

Example 12: The DRAM memory device of example 11, wherein the CA interface comprises a first unidirectional CA interface to receive first CA signals and a second unidirectional CA interface to retransmit the first CA signals.

Example 13: The DRAM memory device of example 12, wherein whether the second unidirectional CA interface to retransmits the first CA signals is determined by a second CA interface mode.

Example 14: The DRAM memory device of example 9, wherein the data interface comprises a first unidirectional data interface to receive first data signals and a second unidirectional data interface to retransmit the first data signals.

Example 15: The DRAM memory device of example 14, wherein the data interface comprises a third unidirectional data interface to receive second data signals and a fourth unidirectional data interface to retransmit the second data signals, the first data signals and the second data signals being transmitted from different devices.

Example 16: The DRAM memory device of example 15, wherein whether the second unidirectional data interface retransmits the first data signals is determined by a second data (DQ) interface mode.

Example 17: A method of operating a DRAM memory device, comprising: receiving configuration information; based on the configuration information, selecting one of a first data interface mode and a second data interface mode; based on the configuration information, selecting one of a first command/address (CA) interface mode and a second CA interface mode; if the first data interface mode is selected, retransmitting data received via a first data interface from a second data interface; if the second data interface mode is selected, not retransmitting data received via the first data interface from the second data interface; if the first CA interface mode is selected, retransmitting CA signal received via a first CA interface from a second CA interface; and, if the second CA interface mode is selected, not retransmitting data received via the first CA interface from the second CA interface.

Example 18: The method of example 17, wherein the configuration information is received via connections to a substrate.

Example 19: The method of example 17, wherein the configuration information is received via signals from another device.

Example 20: The method of example 17, further comprising: receiving, via a first timing interface, a timing reference signal; and, based on a timing reference interface mode, selectively retransmitting the timing reference signal via a second timing interface.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A first memory component, comprising:
a first memory array;
a first command/address (CA) interface to receive CA signals;
a first data interface to receive first data to be written to the first memory array;
a second CA interface to, based on configuration information, perform a one of retransmission of the CA signals received to a second memory component having a second memory array and no retransmission of the CA signals; and
a second data interface to, based on the configuration information, perform a one of retransmission of second data received via the first data interface to the second memory component for storage in the second memory array and no retransmission of data via the second data interface.

2. The memory component of claim 1, wherein the configuration information is to be received via the first CA interface.

3. The memory component of claim 1, wherein the configuration information is to be received via static connections.

4. The memory component of claim 1, wherein the configuration information is to be received via a serial presence detect interface.

5. The memory component of claim 1, wherein the configuration information is to be received via the first data interface.

6. The memory component of claim 1, wherein the configuration information determines whether at least one data strobe signal is retransmitted.

7. A memory device, comprising:
a first data interface to receive first data;
a first memory array to store the first data;
a second data interface to, based on configuration information, retransmit second data received via the first data interface to another memory device for storage in a second memory array of the another memory device;
a first command/address (CA) interface to receive command/address signals; and
a second CA interface to, based on the configuration information, retransmit CA signals received via the first data interface.

8. The memory device of claim 7, wherein the second data interface is to, based on the configuration information, not retransmit data received via the first data interface.

9. The memory device of claim 7, wherein the second CA interface is to, based on the configuration information, not retransmit CA signals received via the first CA interface.

10. The memory device of claim 7, wherein the memory device is to perform, based on receiving a combined activate and read command via the first CA interface, perform a combined activate and read operation.

11. The memory device of claim 10, wherein the memory device is to perform, based on receiving a combined activate and write command via the first CA interface, perform a combined activate and write operation.

12. The memory device of claim 7, wherein the configuration information is to be received via the first data interface.

13. The memory device of claim 7, wherein the configuration information is to be received via the first CA interface.

14. The memory device of claim 7, wherein the configuration information is to be provided to the memory device via at least one mode register set command.

15. The memory device of claim 7, further comprising:
a serial presence detect interface to receive the configuration information.

16. A method of operating a memory device, comprising:
receiving data signals via a first data interface;
based on configuration information, configuring the memory device to operate in one of a first data interface mode and a second data interface mode, the memory device to, in the first data interface mode, retransmit, via a second data interface, the data signals received via the first data interface, the memory device to, in the second data interface mode, not retransmit the data signals received via the first data interface via the second data interface;
receiving command/address (CA) signals via a first CA interface; and
based on the configuration information, configuring the memory device to operate in one of a first CA interface mode and a second CA interface mode, the memory device to, in the first CA interface mode, retransmit, via a second CA interface, the CA signals received via the first CA interface, the memory device to, in the second CA interface mode, not retransmit the CA signals received via the first CA interface via the second CA interface.

17. The method of claim 16, further comprising:
receiving the configuration information.

18. The method of claim 16, wherein the configuration information is indicated by connections to a substrate.

19. The method of claim 16, wherein the configuration information is indicated by signals received from another device.

20. The method of claim 16, wherein the first data interface and the second data interface include data strobe signals and the method further comprises:
based on configuration information, configuring the memory device to operate in one of a first data strobe mode and a second data strobe mode, the memory device to, in the first data strobe mode, retransmit, via the second data interface, data strobe signals received via the first data interface, the memory device to, in the second data interface mode, not retransmit the data strobe signals received via the first data interface via the second data interface.

* * * * *